US012701857B2

(12) United States Patent
Kim et al.

(10) Patent No.: US 12,701,857 B2
(45) Date of Patent: Aug. 4, 2026

(54) DISPLAY PANEL HAVING AUXILIARY ELECTRODE, DISPLAY DEVICE INCLUDING THE SAME, AND METHOD OF MANUFACTURING DISPLAY PANEL

(71) Applicant: Samsung Display Co., Ltd., Yongin-si (KR)

(72) Inventors: Taehyung Kim, Seoul (KR); Seho Lee, Cheonan-si (KR); Yongdae Lee, Seongnam-si (KR); Sangwoo Pyo, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 742 days.

(21) Appl. No.: 17/980,418

(22) Filed: Nov. 3, 2022

(65) Prior Publication Data

US 2023/0157052 A1     May 18, 2023

(30) Foreign Application Priority Data

Nov. 12, 2021     (KR) ........................ 10-2021-0155326

(51) Int. Cl.
 H10K 50/824 (2023.01)
 H10K 50/822 (2023.01)
 (Continued)

(52) U.S. Cl.
 CPC ......... H10K 50/824 (2023.02); H10K 50/822 (2023.02); H10K 59/122 (2023.02);
 (Continued)

(58) Field of Classification Search
 CPC ................................................... H10K 50/824
 (Continued)

(56) References Cited

U.S. PATENT DOCUMENTS 9,362,345 B2    6/2016  Jeong et al.
9,698,388 B2    7/2017  Nirengi et al.
 (Continued)

FOREIGN PATENT DOCUMENTS

CN          218920893 U  *  4/2023  .......... H10K 50/824
JP        2017-123342 A     7/2017
 (Continued)

OTHER PUBLICATIONS

European Search Report for EP Application No. 22205849.7 dated Apr. 4, 2023, 10 pages.

*Primary Examiner* — Ajay Arora
(74) *Attorney, Agent, or Firm* — Womble Bond Dickinson (US) LLP

(57) ABSTRACT

A display panel includes: a base substrate having a base surface parallel to a plane defined by a first direction and a second direction; a circuit layer on the base substrate; a first electrode in a first region on the circuit layer; an auxiliary electrode in a second region on the circuit layer and spaced apart from the first electrode; an organic layer on the first electrode and the auxiliary electrode and including a plurality of openings overlapping the auxiliary electrode, and a second electrode on the organic layer, wherein: the second electrode is electrically connected to the auxiliary electrode via each of the plurality of openings; at least a portion of the organic layer includes a plurality of protrusions having a shape surrounding each of the plurality of openings.

20 Claims, 19 Drawing Sheets

(51) Int. Cl.

| | |
|---|---|
| *H10K 59/122* | (2023.01) |
| *H10K 71/00* | (2023.01) |
| *H10K 59/12* | (2023.01) |
| *H10K 59/38* | (2023.01) |

(52) U.S. Cl.

CPC ......... *H10K 71/00* (2023.02); *H10K 59/1201* (2023.02); *H10K 59/38* (2023.02)

(58) Field of Classification Search

USPC ........................................................ 257/40

See application file for complete search history.

(56) References Cited

U.S. PATENT DOCUMENTS

| | | | |
|---|---|---|---|
| 9,780,158 | B2 | 10/2017 | Lee et al. |
| 10,147,769 | B2 | 12/2018 | Lee et al. |
| 10,923,538 | B2 | 2/2021 | Lee et al. |
| 2006/0024855 | A1 | 2/2006 | Sano |
| 2013/0056784 | A1* | 3/2013 | Lee .................... H10K 59/1315 |
| | | | 438/22 |
| 2014/0239262 | A1* | 8/2014 | Kim .................... H10K 59/123 |
| | | | 257/40 |
| 2016/0093680 | A1 | 3/2016 | Paek et al. |
| 2017/0110530 | A1 | 4/2017 | Lee et al. |
| 2018/0102499 | A1 | 4/2018 | Pyo et al. |
| 2021/0134902 | A1 | 5/2021 | Lee et al. |

FOREIGN PATENT DOCUMENTS

| | | |
|---|---|---|
| KR | 10-2016-0051754 A | 5/2016 |
| KR | 10-2018-0040765 A | 4/2018 |
| KR | 10-2018-0066320 A | 6/2018 |
| KR | 10-1961190 B1 | 3/2019 |
| KR | 10-2065769 B1 | 1/2020 |
| KR | 10-2098745 B1 | 5/2020 |
| KR | 10-2020-0121430 A | 10/2020 |
| KR | 10-2021-0053395 A | 5/2021 |
| KR | 10-2313362 B1 | 10/2021 |

* cited by examiner

FIG. 5

DISPLAY PANEL HAVING AUXILIARY ELECTRODE, DISPLAY DEVICE INCLUDING THE SAME, AND METHOD OF MANUFACTURING DISPLAY PANEL

CROSS-REFERENCE TO RELATED APPLICATION

The present application claims priority to and the of Korean Patent Application No. 10-2021-0155326, filed on Nov. 12, 2021, the entire content of which is incorporated herein by reference.

BACKGROUND

Aspects of some embodiments of the present disclosure herein relate to a display panel, a display device including the same, and a method of manufacturing the display panel.

Multimedia electronic devices such as televisions, mobile phones, tablet computers, navigation devices, game consoles, and the like, may include a display panel for displaying images. The display panel may include a plurality of pixels, and each of the pixels may include a light emitting element which generates light and a driving element connected to the light emitting element.

The display panel provided with an organic light emitting element among light emitting elements may have relatively wide viewing angles, relatively high response speed, relatively low power consumption, etc., and thus has been regarded with much interest as a next generation display panel. However, as the area of an electronic device increases, there is a limitation of the occurrence of non-uniform brightness of the display panel.

The above information disclosed in this Background section is only for enhancement of understanding of the background and therefore the information discussed in this Background section does not necessarily constitute prior art.

SUMMARY

Aspects of some embodiments of the present disclosure herein relate to a display panel, a display device including the same, and a method of manufacturing the display panel, and for example, to a display panel having relatively improved reliability, a display device including the same, and a method of manufacturing the display panel.

Aspects of some embodiments of the present disclosure include a display panel having relatively uniform brightness and relatively improved reliability, and a method of manufacturing the same.

Aspects of some embodiments of the present disclosure may also include a display device including the display panel having relatively improved reliability.

Aspects of some embodiments of the present disclosure include a display panel including a base substrate configured to provide a base surface parallel to a plane defined by a first direction and a second direction crossing the first direction, a circuit layer on the base substrate, a first electrode in a first region on the circuit layer, an auxiliary electrode in a second region on the circuit layer and spaced apart from the first electrode, an organic layer on the first electrode and the auxiliary electrode and includes a plurality of openings overlapping the auxiliary electrode, and a second electrode on the organic layer, wherein the second electrode is electrically connected to the auxiliary electrode via each of the plurality of openings, at least a portion of the organic layer includes a plurality of protrusions having a shape surrounding each of the plurality of openings, and the width of each of the plurality of protrusions in the first direction is about 7 μm or more on a plane.

According to some embodiments, the width of each of the plurality of openings in the first direction may be about 0.6 times to about 0.8 times over the width of each of the plurality of protrusions in the first direction.

According to some embodiments, the sheet resistance of the second electrode may be about 30Ω/□ or less.

According to some embodiments, the thickness of the second electrode may be about 50 Å or more.

According to some embodiments, the organic layer may include about 200 thousand to about one million of the plurality of openings.

According to some embodiments, the organic layer may include a first stack on the first electrode and includes a first opening overlapping the auxiliary electrode, a charge generation layer on the first stack and includes a second opening overlapping the first opening, and a second stack on the charge generation layer and includes a third opening overlapping the first opening and the second opening.

According to some embodiments, the first stack may include a first emission layer overlapping the first electrode, the second stack may include a second emission layer overlapping the first electrode, and the first emission layer may emit light having different color from the second emission layer.

According to some embodiments, the display panel may further include a capping layer on the second electrode and an encapsulation layer on the capping layer, wherein the encapsulation layer may include a plurality of inorganic films and at least one organic film between the plurality of inorganic films.

According to some embodiments, the auxiliary electrodes may have a circular shape or a rectangular shape on a plane.

According to some embodiments, the width of the auxiliary electrode in the first direction may be about 7 μm to about 60 μm.

According to some embodiments, the base substrate may be divided into a first light emitting region configured to provide light in a first wavelength region, a second light emitting region configured to provide light in a second wavelength region, a third light emitting region configured to provide light in a third wavelength region different from the first wavelength region and the second wavelength region, and a non-light emitting region surrounding each of the first to third light emitting regions, and the auxiliary electrode may be in the non-light emitting region.

According to some embodiments, each of the first light emitting region, the second light emitting region, and the third light emitting region may be provided in plurality, and the auxiliary electrode may be between the plurality of first light emitting regions.

According to some embodiments, when the distance between two first light emitting regions adjacent along the first direction among the plurality of first light emitting regions is defined as a first distance, the width of the auxiliary electrode in the first direction may be about 4% to about 20% of the first distance.

According to some embodiments, the organic layer may include an opening region overlapping the opening, an intermediate region surrounding the opening, and a protruding region which surrounds the intermediate region and in which the protrusion is located, wherein the slope of the organic layer in the intermediate region may be smaller than that of the organic layer in the protruding region.

According to some embodiments of the inventive concept, a display device includes a display panel including an emission layer emitting source light, and a light control member on the display panel and includes a plurality of light control patterns configured to transmit the source light or convert the wavelength of the source light, wherein the display panel includes a base substrate configured to provide a base surface parallel to a plane defined by a first direction and a second direction crossing the first direction, a circuit layer on the base substrate, a first electrode in a first region on the circuit layer, an auxiliary electrode in a second region on the circuit layer and spaced apart from the first electrode, an organic layer on the first electrode and the auxiliary electrode and includes a plurality of openings overlapping the auxiliary electrode, and a second electrode on the organic layer, wherein the second electrode is electrically connected to the auxiliary electrode via each of the plurality of openings, at least a portion of the organic layer includes a plurality of protrusions having a shape surrounding each of the plurality of openings, and the width of each of the plurality of protrusions in the first direction is about 7 µm or more on a plane.

According to some embodiments, at least one among the plurality of light control patterns may include a quantum dot.

According to some embodiments, the light control member may further include a light shielding pattern between each of the plurality of light control patterns.

According to some embodiments of the inventive concept, a method of manufacturing a display panel includes providing a target substrate including a base substrate configured to provide a base surface parallel to a plane defined by a first direction and a second direction crossing the first direction, a pixel electrode on the base substrate, and an auxiliary electrode on the same layer as the pixel electrode; forming an organic layer including an emission layer on the pixel electrode and the auxiliary layer; forming, by emitting a laser, an opening that passes through the organic layer on the auxiliary layer, and a protrusion adjacent to the opening; and forming a counter electrode on the organic layer, wherein the counter electrode is electrically connected to the auxiliary electrode via the opening, and the width of the protrusion in the first direction is about 7 µm or more on a plane.

According to some embodiments, the protrusion may be formed by the laser at the same time in the forming of the opening, and may surround the opening on a plane.

According to some embodiments, in the forming of the opening and the protrusion, an intermediate portion may be between the opening and the protrusion, and the slope of the intermediate portion may be smaller than that of the organic layer on which the protrusion is located.

BRIEF DESCRIPTION OF THE FIGURES

The accompanying drawings are included to provide a further understanding of the inventive concept, and are incorporated in and constitute a part of this specification. The drawings illustrate aspects of some embodiments of the inventive concept and, together with the description, serve to explain aspects of some embodiments of the inventive concept. In the drawings:

FIG. 5 is a cross-sectional view of a display panel according to some embodiments of the inventive concept;

DETAILED DESCRIPTION

Figure 1A:
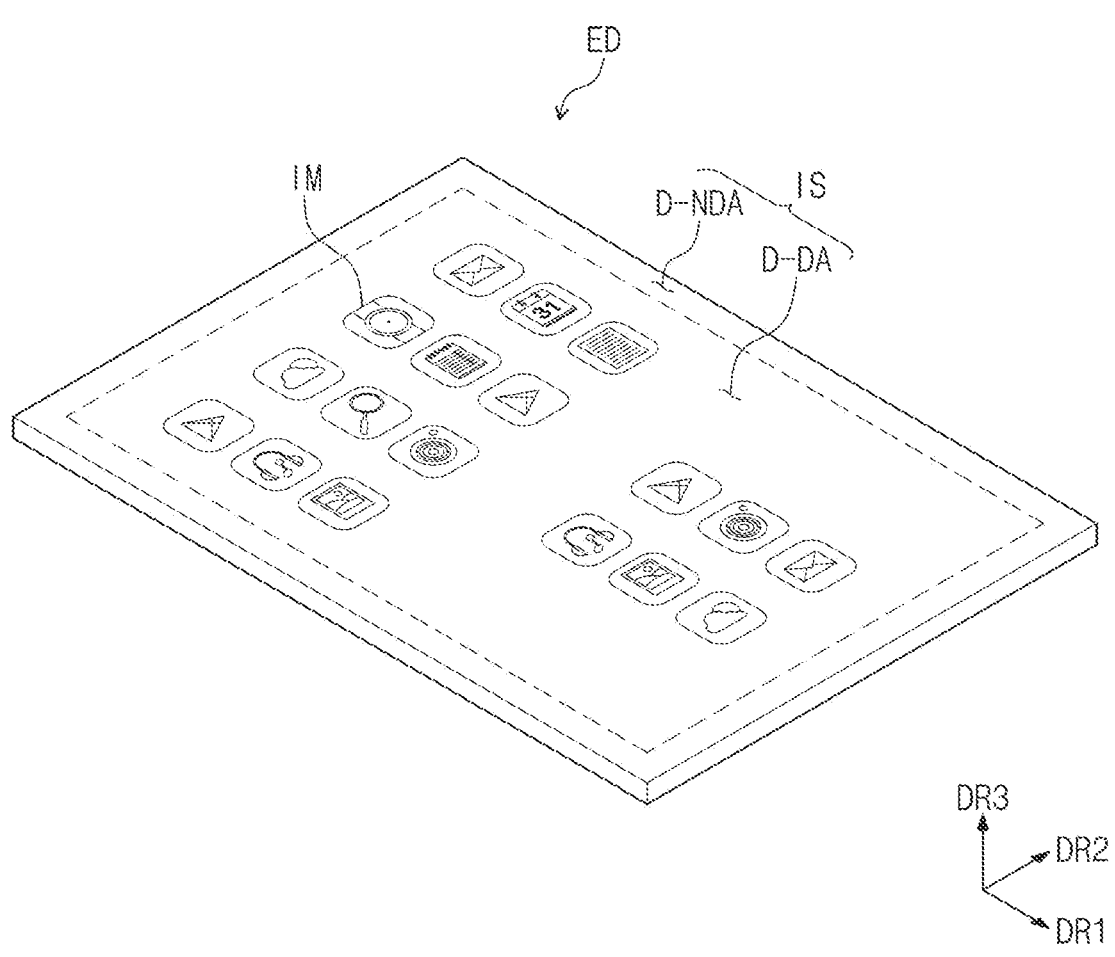
FIG. 1A is a perspective view of an electronic device according to some embodiments of the inventive concept.

Hereinafter, aspects of some embodiments of the inventive concept will be described in more detail with reference to the accompanying drawings.

In this specification, it will also be understood that when a component (a region, a layer, a portion, or the like) is referred to as "being on," "being connected to," or "being coupled to" another component, it may be directly connected/coupled to the another component, or an intervening third component may be also located therebetween.

Like reference numerals refer to like components throughout. Also, in the drawings, the thicknesses, ratios, and dimensions of the components are exaggerated for effective description of technical contents. The term "and/or" includes all combinations of one or more of which associated configurations may define.

It will be understood that, although the terms "first", "second", etc. may be used herein to describe various elements, these elements should not be limited by these terms. These terms are only used to distinguish one component from another. For example, a first component could be termed a second component, and, similarly, a second component could be termed a first component, without departing from the scope of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "include," "have," or the like are intended to specify the presence of stated features, integers, steps, operations, components, parts, or combinations thereof in the disclosure, but do not preclude the presence or addition of one or more other features, integers, steps, operations, components, parts, or combinations thereof.

Being "directly located on" herein means that there are no intervening layers, films, regions, plates, or the like between a part such as a layer, a film, an area, and a plate and another part. For example, being "directly located on" may mean being located between two layers or two members without using an additional member, such as an adhesive member.

Unless otherwise defined, all terms (including technical and scientific terms) used herein have the same meaning as commonly understood by one of ordinary skill in the art to which the inventive concept belongs. In addition, it will be understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display panel according to some embodiments of the inventive concept, a display device, and a method of manufacturing the display panel will be described in more detail with reference to the accompanying drawings.

Figure 1B:
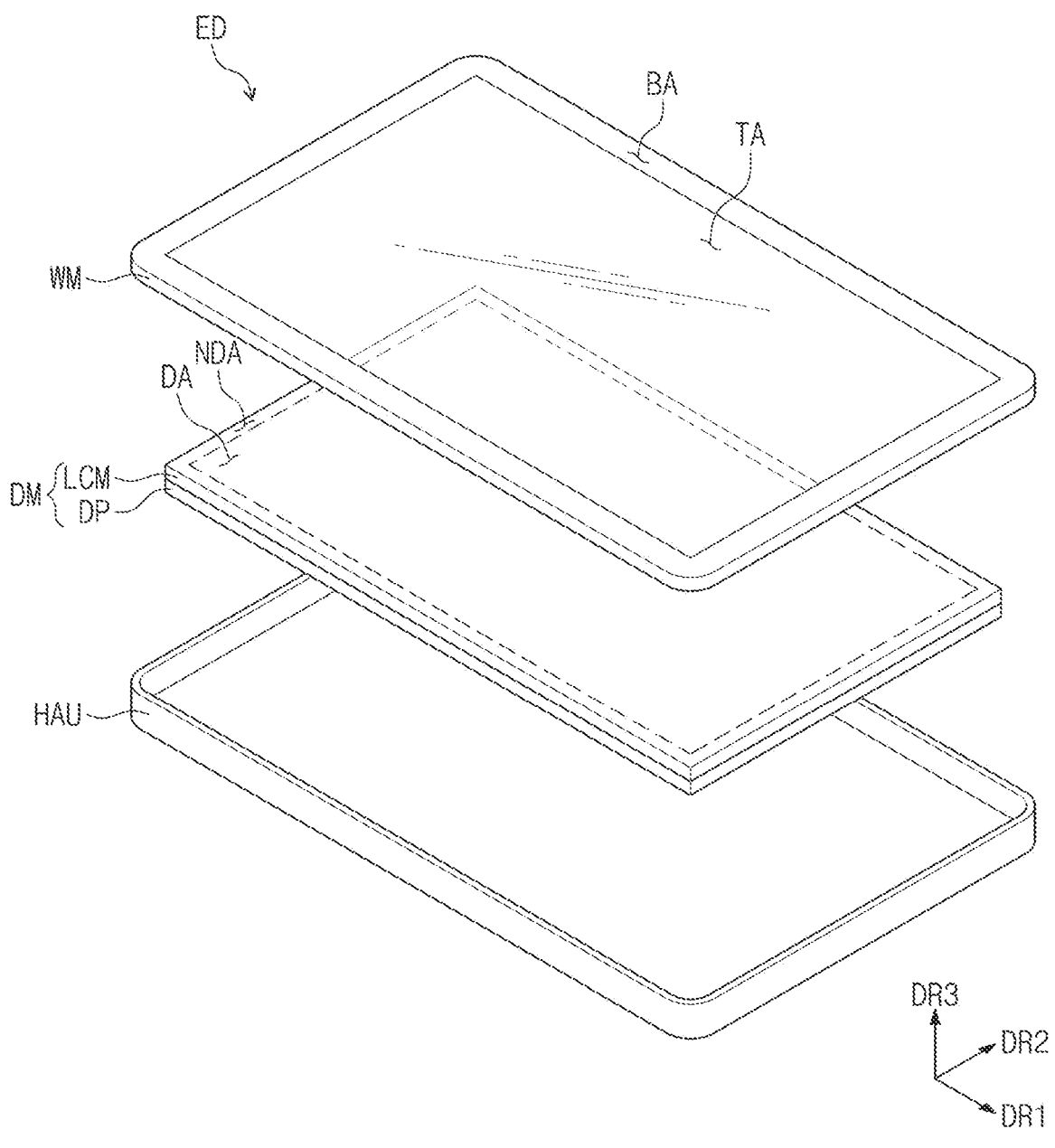
FIG. 1B is an exploded perspective view of an electronic device according to some embodiments of the inventive concept.
Figure 1C:
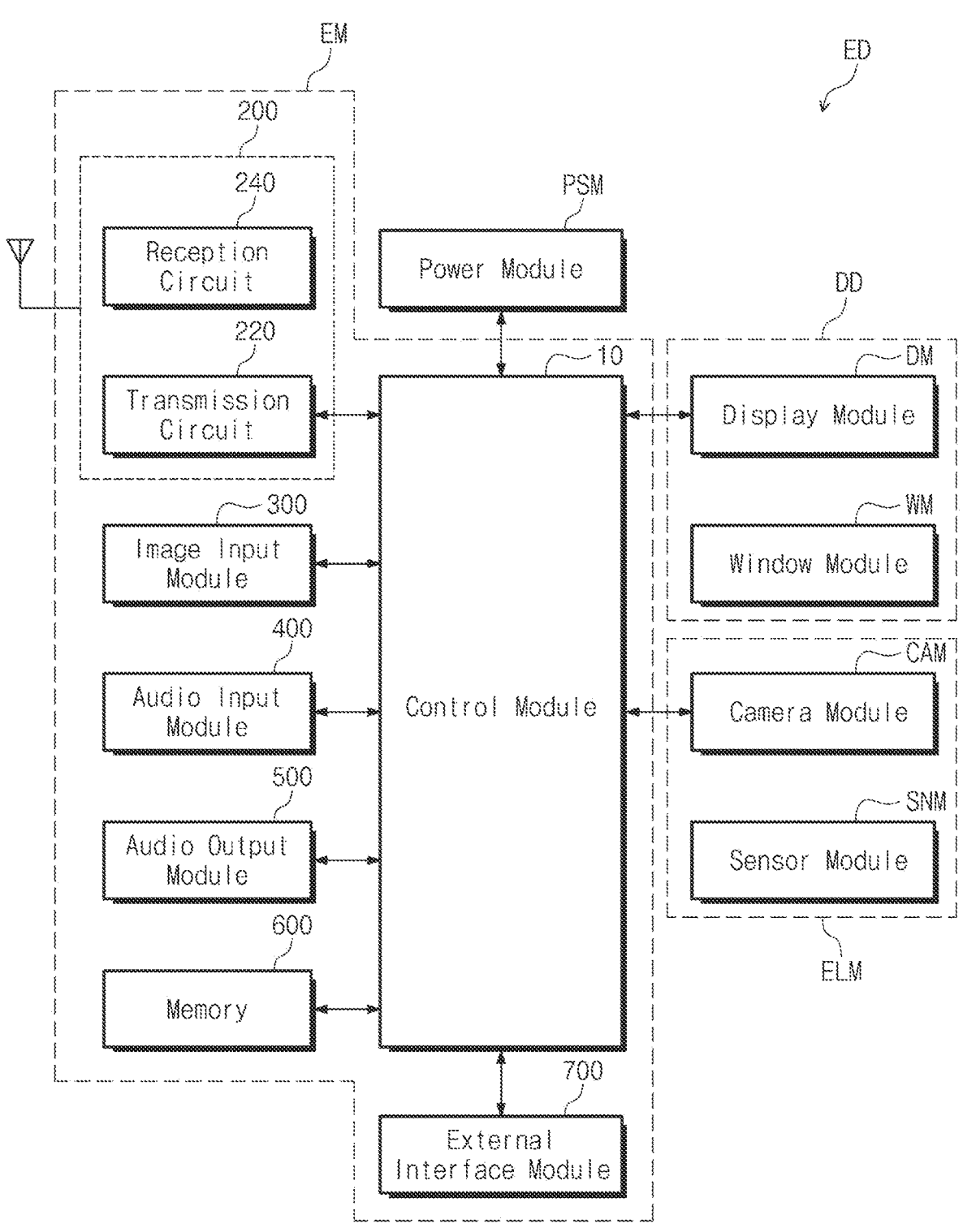
FIG. 1C is a block diagram of an electronic device according to some embodiments of the inventive concept.

FIG. 1A is a perspective view of an electronic device according to some embodiments of the inventive concept. FIG. 1B is an exploded perspective view of an electronic device according to some embodiments of the inventive concept. FIG. 1C is a block diagram of an electronic device according to some embodiments.

An electronic device ED may be a device which is activated in response to an electrical signal and displays images. The electronic device ED may include various embodiments, and for example, the electronic device ED may include large-sized devices such as a television and an outdoor advertising board, and small and middle-sized devices such as a monitor, a mobile phone, a tablet computer, a navigation device, and a game console. Meanwhile, the above example embodiments of the electronic devices ED are merely an illustration, and thus the electronic device ED is not limited to any one as long as it does not depart from the spirit and scope of embodiments according to the inventive concept.

Referring to FIG. 1A, the electronic device ED is may have a rectangular shape having long sides extending in a first direction DR1 and short sides extending in a second direction DR2. However, the electronic device ED is not limited hereto, and may have various shapes such as a circular shape and a polygonal shape.

The electronic device ED may display an image IM in a third direction DR3 on a display surface IS parallel to a plane defined by the first direction DR1 and the second direction DR2. The third direction DR3 may be parallel to the normal direction of the display surface IS. The display surface IS on which the image IM is displayed may correspond to a front surface of the electronic device ED. The image IM may include a still image (or static image) as well as a dynamic image (e.g., a video image). FIG. 1A illustrates icon images as an example of the image IM.

According to some embodiments, a front surface (or a top surface) and a rear surface (or a bottom surface) of each of members or units may be defined based on the direction in which the image IM is displayed. The front surface and the rear surface may be opposed to each other in the third direction DR3, and the normal direction of each of the front surface and the rear surface may be parallel to the third direction DR3. The separation distance between the front surface and the rear surface defined along the third direction DR3 may correspond to the thickness of the member (or the unit). In the present specification, the third direction DR3 may be referred to as a "thickness direction."

In the present specification, "on a plane" may be defined as a state when viewed in the third direction DR3. In the present specification, "on a cross-section" may be defined as a state when viewed in the first direction DR1 or the second direction DR2. Meanwhile, the directions indicated by the first to third directions DR1, DR2 and DR3 may be a relative concept and thus converted to other directions.

FIG. 1A illustrates an electronic device ED having a flat display surface IS. However, the shape of the display surface IS of the electronic device ED is not limited thereto, and may be a curved shape or a three-dimensional shape.

The electronic device ED may be flexible. The term "flexible" refers to a property that may be bent, and may include everything from a fully folded structure to a structure that may be bent at a level of several nanometers. For example, the flexible electronic device ED may include a curved display device or a foldable display device. However, the embodiments of the inventive concept are not limited thereto, and the electronic device ED may be rigid.

The display surface IS of the electronic device may include a display part D-DA and a non-display part D-NDA. The image IM may be displayed on the display part D-DA. A user may view the image IM through the display part D-DA. According to some embodiments, the display part D-DA is illustrated to have a rectangular shape, but this is illustrated as an example, and the display part D-DA may have various shapes.

The image IM may be not displayed on the non-display part D-NDA. The non-display part D-NDA may have a certain color, and correspond to a part that shields light. The non-display part D-NDA may be adjacent to the display part D-DA. For example, the non-display part D-NDA may be located outside the display part D-DA to surround the display part D-DA. However, this is illustrated as an example, and the non-display part D-NDA may be adjacent only to one side of the display part D-DA, or may be located on the side surface of the electronic device ED rather than the front surface, and the embodiments of the inventive concept are not limited thereto, and the non-display part D-NDA may be omitted.

Meanwhile, the electronic device ED according to some embodiments may sense an external input applied from the outside. The external input may have various forms such as pressure, temperature, and light. The external input may include an input (e.g., hovering) applied when approaching the electronic device ED as well as an input by contact (e.g., contact by a user's hand or a pen) with the electronic device ED.

Referring to FIG. 1B, the electronic device ED may include a window WM, a display module DM, and a case HAU. The display module DM may include a display panel DP and a light control member LCM.

The window WM and the case HAU may be coupled to define an outer appearance of the electronic device ED, and provide an internal space which may accommodate components, such as the display module DM, of the electronic device ED.

The window WM may be located on the display module DM. The window WM may protect the display module DM against an external impact. The front surface of the window WM may correspond to the display surface IS of the electronic device ED as described above. The front surface of the window WM may include a transmission region TA and a bezel region BA.

The transmission region TA of the window WM be an optically clear region. The window WM may transmit an image provided from the display module DM through the transmission region TA, and a user may view the image. The transmission region TA may correspond to the display part D-DA of an electronic device ED.

The window WM may include an optically transparent insulating material. For example, the window WM may include glass, sapphire, or plastic. The window WM may have a single-layer structure or a multi-layer structure. The window WM may further include functional layers, such as an anti-fingerprint layer, a phase control layer, and a hard coating layer, on an optically clear substrate.

The bezel region BA of the window WM may be provided as a region in which materials containing a certain color are deposited, coated, or printed. The bezel region BA of the window WM may prevent one component of the display module DM arranged to overlap the bezel region BA from being viewed from the outside. The bezel region BA may correspond to the non-display part D-NDA of the electronic device ED.

The display module DM may be located between the window WM and the case HAU. The display module DM may display an image in response to an electrical signal. The display module DM may include a display region DA and a non-display region NDA adjacent to the display region DA.

The display region DA may be a region activated in response to an electrical signal. The display region DA may be a region emitting an image provided from the display module DM. The display region DA of the display module DM may correspond to the transmission region TA. Meanwhile, as used herein, the sentence "a region/portion corresponds to a region/portion" means "they overlap each other," but is not limited to having the same area and/or the same shape. The image displayed on the display region DA may be viewed from the outside through the transmission region TA.

The non-display region NDA may be adjacent to the display region DA. For example, the non-display region NDA may surround the display region DA. However, the embodiments of the inventive concept are not limited thereto, and the non-display region NDA may be defined to have various shapes. The non-display region NDA may be a region in which a driving circuit or a driving line for driving the display region DA, and various signal lines and pads for providing electrical signals are located. The non-display region NDA of the display module DM may correspond to the above-described bezel region BA. The components of the display module DM located in the non-display region NDA may be prevented by the bezel region BA from being viewed from the outside.

The display panel DP according to some embodiments may be a light emitting display panel, but embodiments are not particularly limited thereto. For example, the display panel DP may be an organic light emitting display panel, an inorganic light emitting display panel, or a quantum-dot light emitting display panel. An emission layer of the organic light emitting display panel may include an organic light emitting material and an emission layer of the inorganic light emitting display panel may include an inorganic light emitting material. The light emitting layer of the quantum-dot light emitting display panel may include quantum dot, quantum rod, and the like. Hereinafter, the display panel DP will be described as an organic light emitting display panel.

The light control member LCM may be located on the display panel DP. The light control member LCM may be provided on the display panel DP, and then may be coupled to the display panel DP through a bonding process using a sealing member. However, the embodiments of the inventive concept are not limited thereto, and the light control member LCM may be directly located on the display panel DP. In the present specification, that no separate adhesive layers and adhesive members are located and the components are formed by a continuous process may be expressed as "directly located." For example, the expression "the light control member LCM is directly located on the display panel DP" may indicate that the display panel DP is formed, and then the components of the light control member LCM are formed through a continuous process on the base surface provided by the display panel DP.

The light control member LCM may include light control patterns that may convert optical properties of source light provided from the display panel DP. The light control member LCM may optionally convert a wavelength or color of the source light or may transmit the source light. The light control member LCM may control the color purity or color reproduction rate of light emitted from the electronic device ED, and may prevent external light, which is incident from the outside of the electronic device ED, from being reflected.

The case HAU may be disposed below the display module DM to accommodate the display module DM. The case HAU may absorb the impact applied from the outside and prevent foreign substances/moisture from penetrating into the display module DM, thereby protecting the display module DM. The case HAU according to some embodiments may be provided by coupling a plurality of accommodation members.

Meanwhile, the display module DM may further include an input sensing unit. The input sensing unit may obtain coordinate information of the external input applied from the outside of the electronic device ED. The input sensing unit may be located between the display panel DP and the light control member LCM. For example, the input sensing unit may be directly located on the display panel DP through the continuous process, or not limited thereto, and the input sensing unit may be manufactured separately and attached, via an adhesive layer, onto the display panel DP.

FIG. 1B schematically illustrates the configuration of the electronic device ED, but according to some embodiments, the electronic device ED may substantially include various functional modules as illustrated in FIG. 1C. Referring to FIG. 1C, the electronic device ED may include an electronic module EM, a power module PSM, a display device DD, and an electronic optical module ELM.

The electronic module EM may include a control module 100, a wireless communication module 200, an image input module 300, an audio input module 400, an audio output module 500, a memory 600, an external interface module 700, and the like. These modules may be mounted on a circuit board or electrically connected through a flexible circuit board. The electronic module EM may be electrically connected to the power module PSM.

The control module 100 may control overall operations of the electronic device ED. For example, the control module 100 may activate or deactivate the display device DD in response to a user's input. The control module 100 may control the image input module 300, the audio input module 400, the audio output module 500, and the like in response to the user's input. The control module 100 may include at least one microprocessor.

The wireless communication module 200 may receive and transmit a wireless signal from and to another terminal by using Bluetooth or Wi-Fi line. The wireless communication module 200 may transmit/receive a voice signal using a general communication line. The wireless communication module 200 may include a transmission circuit 220 that modulates and transmits a signal to be transmitted, and a reception circuit 240 that demodulates a received signal.

The image input module 300 may process an image signal and convert the image signal into image data that may be displayed on the display device DD. The audio input module 400 may receive an external audio signal by using a microphone in a recording mode, a voice recognition mode or the like, and may convert the received external audio signal into electrical voice data. The audio output module 500 may convert audio data received from the wireless communication module 200 or audio data stored in the memory 600, and may output the converted audio data to the outside.

The external interface module 700 may serve as an interface that is connected to an external charger, a wired/wireless data port, a card socket (e.g., a memory card and a SIM/UIM card), or the like.

The power module PSM may supply power required for overall operations of the electronic device ED. The power module PSM may include a typical battery device.

The electronic optical module ELM may be an electronic part that outputs or receives an optical signal. The electronic optical module ELM may transmit or receive the optical signal through some regions of the display device DD. According to some embodiments, the electronic optical module ELM may include a camera module CAM and a sensor module SNM.

Figure 2:
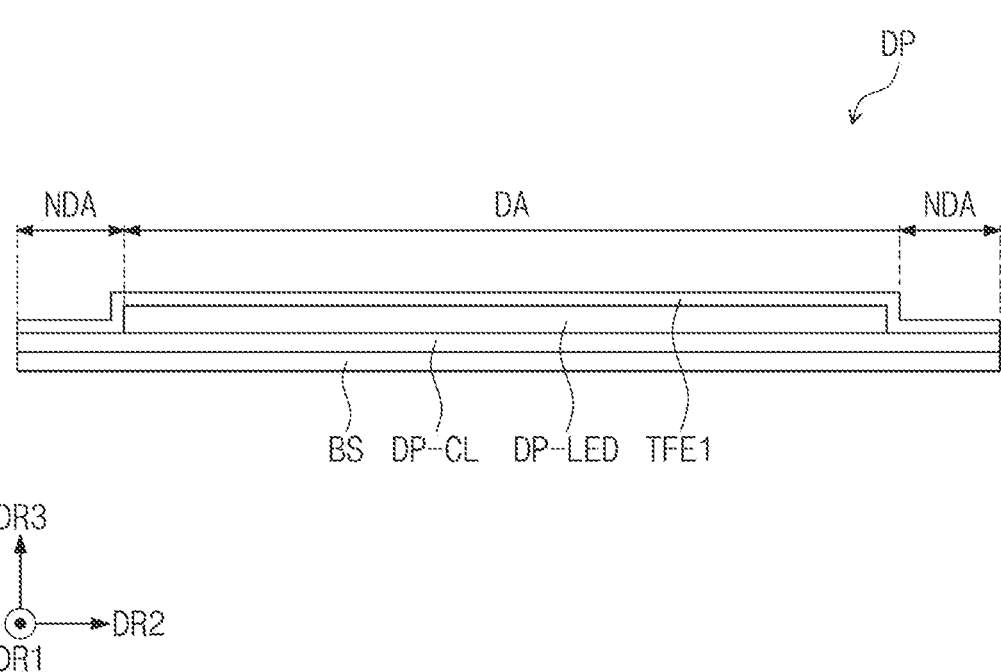
FIG. 2 is a cross-sectional view of a display according to some embodiments of the inventive concept.

FIG. 2 is a cross-sectional view of a display panel according to some embodiments of the inventive concept. Referring to FIG. 2, the display panel DP may include a base substrate BS, a circuit layer DP-CL, a display element layer DP-LED, and an encapsulation layer TFE1.

The base substrate BS may include a display region DA and a non-display region NDA. The base substrate BS may provide a base surface on which the circuit layer DP-CL is located. The base substrate BS may be a rigid substrate, or not limited thereto, and may be a flexible substrate. The base substrate BS may provide a base surface parallel to a plane defined by the first direction DR1 and the second direction DR2, and the circuit layer DP-CL, the display element layer DP-LED, and the encapsulation layer TFE1 may be sequentially arranged on the base surface of the base substrate BS. Meanwhile, the above-described third direction DR3 may be the vertical direction to the base surface of the base substrate BS, and the circuit layer DP-CL, the display element layer DP-LED, and the encapsulation layer TFE1 may be sequentially arranged along the third direction DR3.

The circuit layer DP-CL may be located on the base substrate BS. The circuit layer DP-CL may include driving elements, signal lines, and signal pads. The display element layer DP-LED may include light emitting elements that are arranged to overlap the display region DA. The light emitting elements of the display element layer DP-LED may be electrically connected to the driving elements of the circuit layer DP-CL, and may provide the source light through the display region DA in response to a signal of the driving element.

The encapsulation layer TFE1 may be located on the display element layer DP-LED to seal the light emitting elements. The encapsulation layer TFE1 may include a plurality of thin films. The thin films of the encapsulation layer TFE1 may be formed in order to improve optical efficiency and protect the light emitting elements.

Figure 3A:
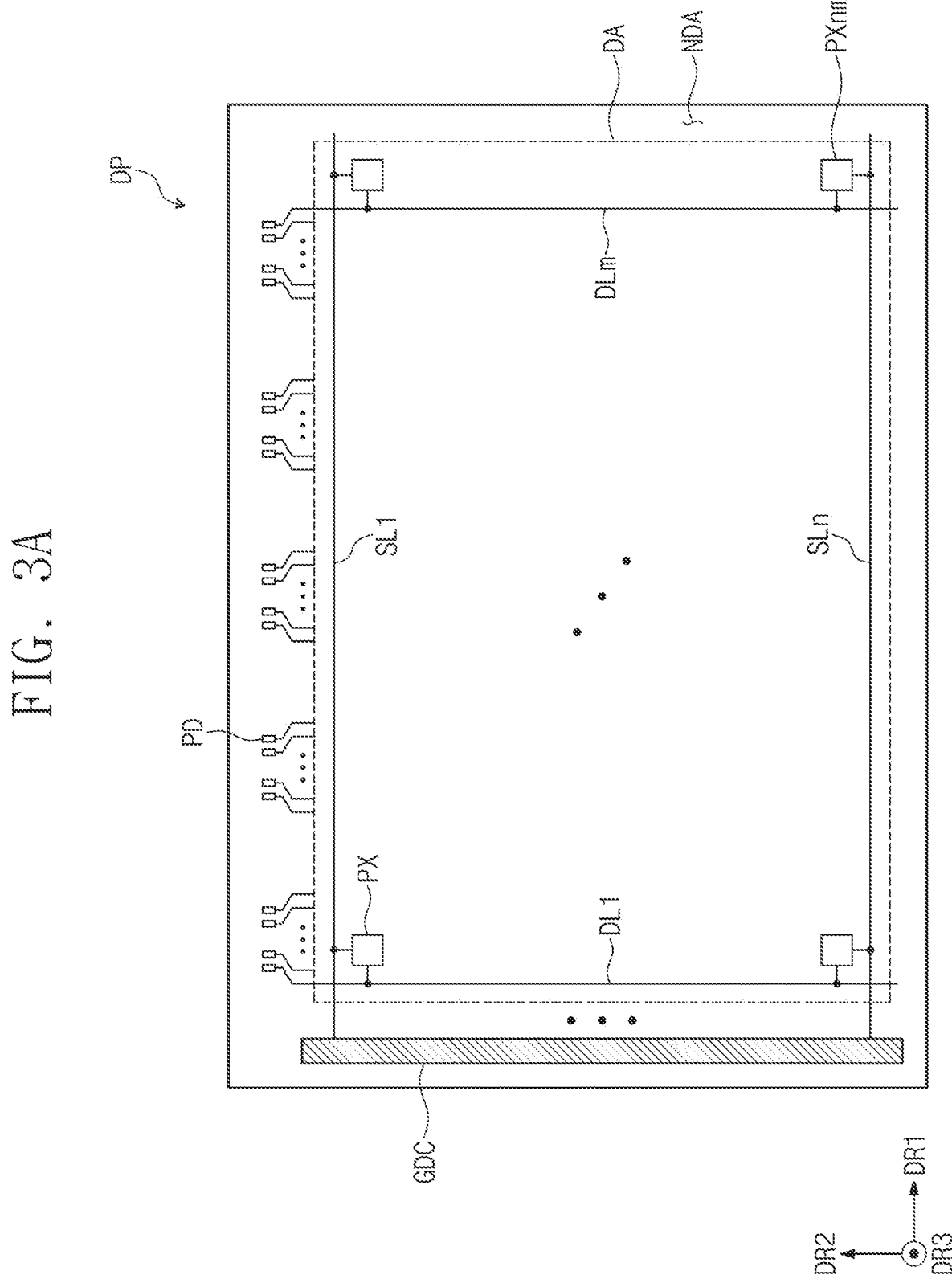
FIG. 3A is a plan view of a display panel according to some embodiments of the inventive concept.
Figure 3B:
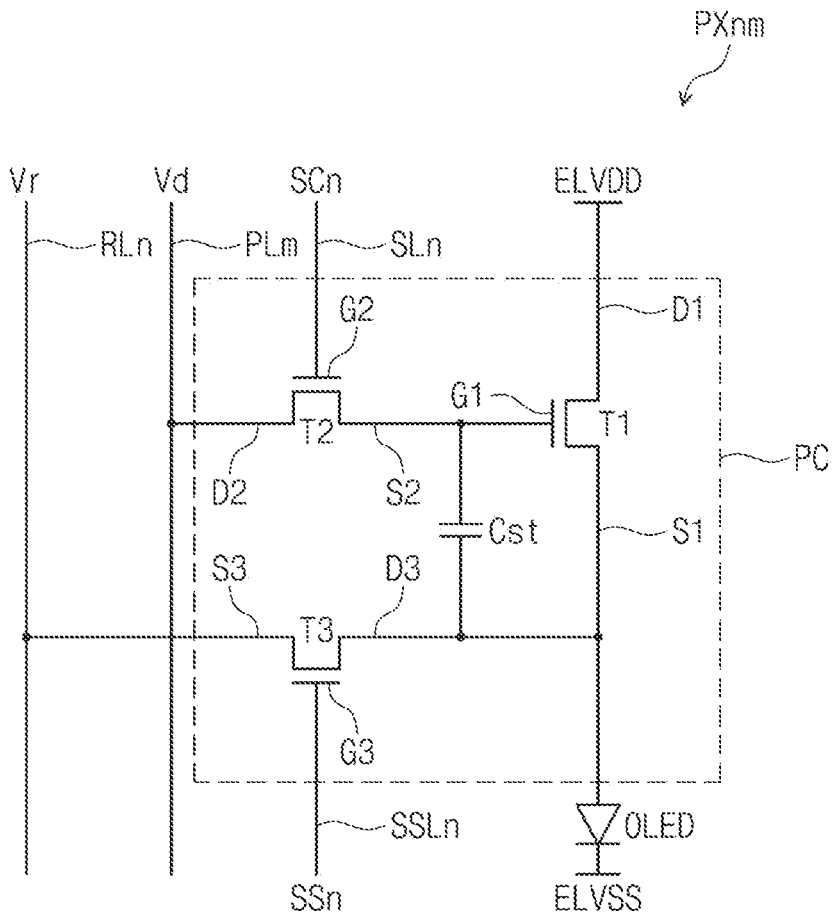
FIG. 3B is an equivalent circuit diagram of a pixel according to some embodiments of the inventive concept.

FIG. 3A is a plan view of a display panel according to some embodiments of the inventive concept. FIG. 3B is an equivalent circuit diagram of a pixel according to some embodiments of the inventive concept.

Referring to FIG. 3A, the display panel DP may include pixels PX11 to PXnm located in the display region DA and signal lines SL1 to SLn and DL1 to DLm that are electrically connected to the pixels PX11 to PXnm. The display panel DP may include a driving circuit GDC and pads PD located in the non-display region NDA.

Each of the pixels PX11 to PXnm may include a light emitting element, a plurality of transistors (e.g., a switching transistor, a driving transistor, etc.) connected to the light emitting element, and a pixel driving circuit including a capacitor. Each of the pixels PX11 to PXnm may emit light in response to an electrical signal (e.g., a data signal) applied to the pixel. FIG. 3A illustrates an example arrangement of pixels PX11 to PXnm arranged in a matrix form or configuration, but the arrangement configuration of the pixels PX11 to PXnm is not limited thereto.

The signal lines SL1 to SLn and DL1 to DLm may include scan lines SL1 to SLn and data lines DL1 to DLm. Each of the pixels PX11 to PXnm may be connected to the corresponding scan line among the scan lines SL1 to Sln and the corresponding data line among the data lines DL1 to DLm. According to the configuration of the pixel driving circuit of the pixels PX11 to PXnm, more types of signal lines may be provided in the display panel DP.

The driving circuit GDC may include a gate driving circuit. The gate driving circuit may generate gate signals, and may sequentially output the gate signals to the scan lines SL1 to SLn. The gate driving circuit may further output other control signals to the pixel driving circuit of the pixels PX11 to PXnm.

The driving circuit GDC and pixels PX11 to PXnm according to some embodiments may include a plurality of thin film transistors formed through a low temperature polycrystalline silicon (LTPS) process, a low temperature polycrystalline oxide (LTPO) process, or an oxide semiconductor process.

The pads may be arranged along one direction on the non-display region NDA. The pads PD may be a part connected to the circuit board. Each of the pads PD may be connected the corresponding signal line among the signal lines SL1 to SLn and DL1 to DLm, and may be electrically connected to the corresponding pixel via the signal line. The pads PD may have an integrated shape with the signal lines SL1 to SLn and DL1 to DLm. However, the embodiments of the inventive concept are not limited thereto, and the pads PD may be located on a layer different from the layer of the signal lines SL1 to SLn and DL1 to DLm, and may be connected to the signal lines SL1 to SLn and DL1 to DLm through a contact hole.

FIG. 3B illustrates the pixel PXnm connected to an n-th scan line SLn, an n-th sensing line SSLn, an m-th data line DLm, and an m-th reference line RLm. Referring to FIG. 3B, the pixel PXnm may include a pixel circuit PC and a light emitting element OLED connected to the pixel circuit PC.

The pixel circuit PC may include a plurality of transistors T1, T2, and T3 and a capacitor Cst. The plurality of transistors T1, T2, and T3 may include a first transistor T1 (or a driving transistor), a second transistor T2 (or a switching transistor), and a third transistor T3 (or a sensing transistor). Each of the first to third transistors T1, T2, and T3 may be a thin film transistor.

The first to third transistors T1, T2, and T3 may be NOMS transistors, but are not limited thereto, and may be PMOS transistors. The first to third transistors T1, T2, and T3 may include sources S1, S2, and S3, drains D1, D2, and D3, and gates G1, G2, and G3, respectively.

The light emitting element OLED may be an organic light emitting element including an anode (or a first electrode) and a cathode (or a second electrode). The anode of the light emitting element OLED may receive a first voltage ELVDD via the driving transistor T1 and the cathode of the light emitting element OLED may receive a second voltage ELVSS. The light emitting element OLED may receive the first voltage ELVDD and the second voltage ELVSS to emit light.

The driving transistor T1 may include the drain D1 that receives the first voltage ELVDD, the source S1 connected to the anode of the light emitting element OLED, and the gate G1 connected to the capacitor Cst. The driving transistor T1 may control a driving current that flows through the light emitting element OLED from the first voltage ELVDD according to a voltage value stored in the capacitor Cst.

The switching transistor T2 may include the drain D2 connected to the m-th data line DLm, the source S2 connected to the capacitor Cst, and the gate G2 that receives an n-th write scan signal SCn. The m-th data line DLm may receive a data voltage Vd and a data voltage for sensing. The switching transistor T2 may transmit the data voltage Vd input from the m-th data line DLm to the driving transistor T1 according to the switching voltage input from the n-th write scan signal SCn.

The switching transistor T3 may include the source S3 connected to the m-th reference line RLm, the drain D3 connected to the anode of the light emitting element OLED, and the gate G3 that receives an n-th sampling scan signal SSn. The m-th reference line RLm may receive a reference voltage Vr.

The capacitor Cst may be connected to the gate G1 of the driving transistor T1 and the anode of the light emitting element OLED. The capacitor Cst may include a first capacitor electrode connected to the gate G1 of the driving transistor T1 and a second capacitor electrode connected to the anode of the light emitting element OLED. The capacitor Cst may store a voltage corresponding to the difference between the voltage transmitted from the switching transistor T2 and the first voltage ELVDD.

Meanwhile, an equivalent circuit of the pixel PXnm is not limited to the equivalent circuit illustrated in FIG. 3B. According to some embodiments of the inventive concept, an equivalent circuit diagram of the pixel PXnm may be implemented in various forms to allow the light emitting element OLED to emit light.

Figure 4A:
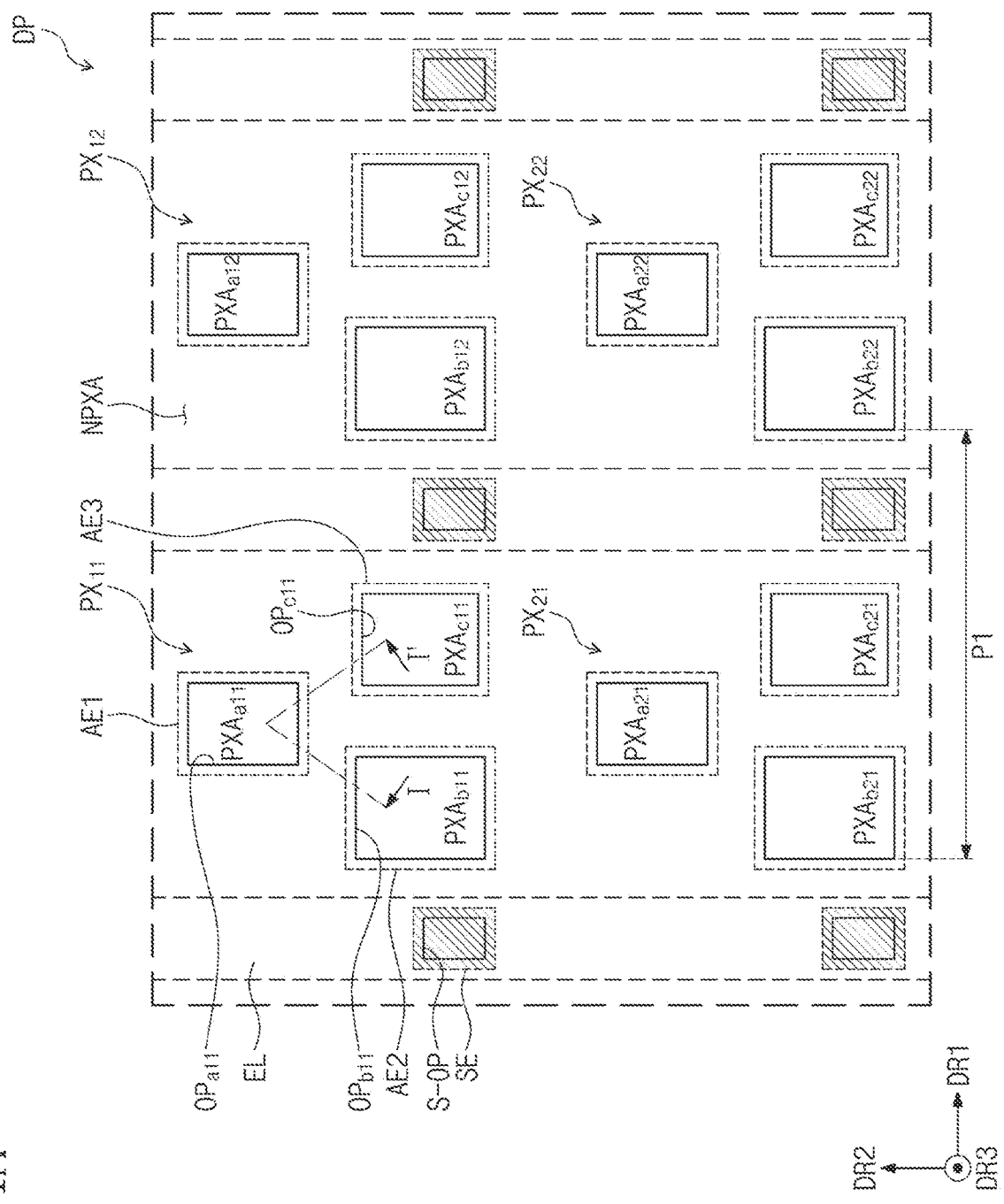
FIG. 4A is an enlarged plan view of a display panel according to some embodiments of the inventive concept.
Figure 4B:
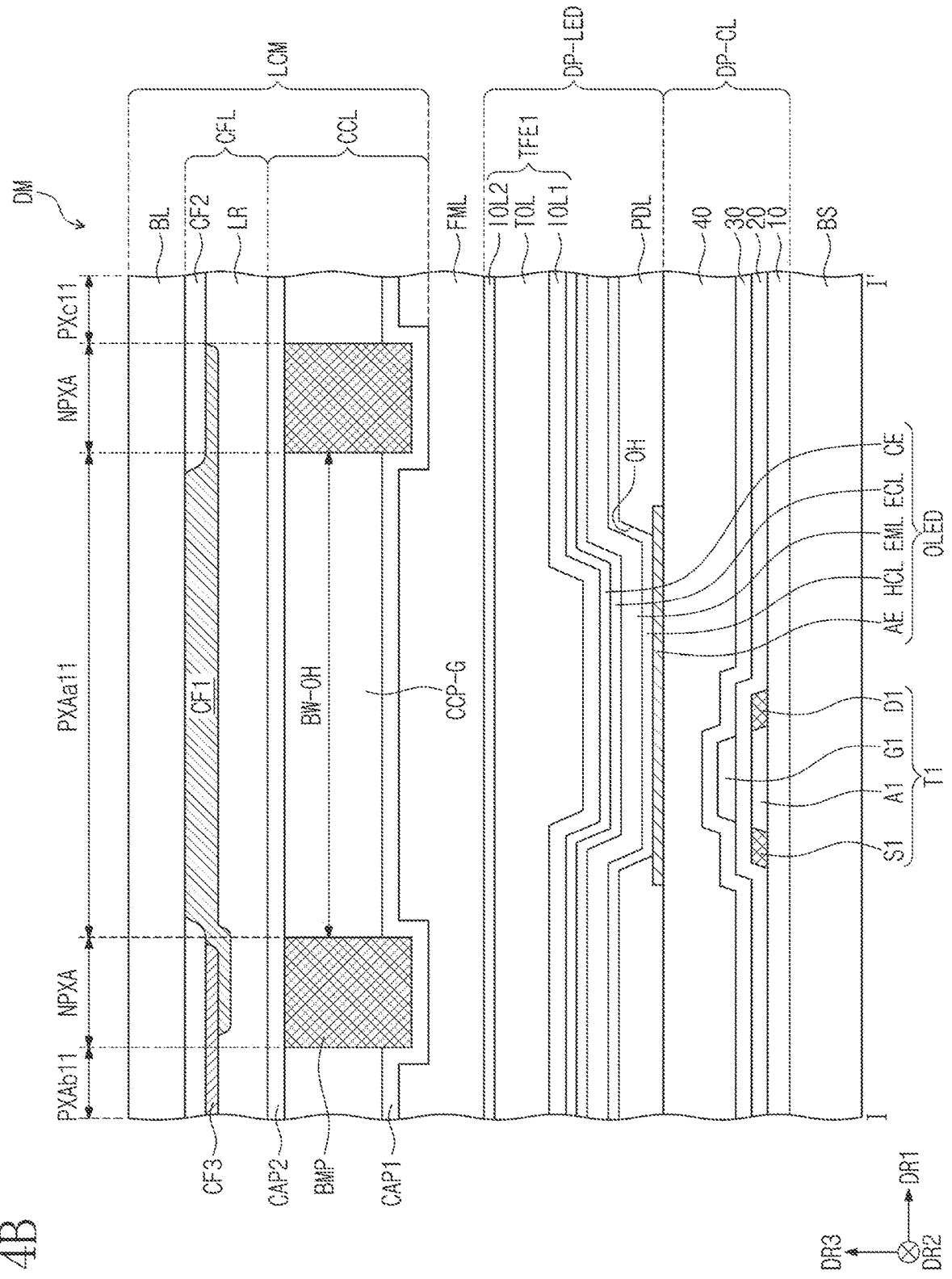
FIG. 4B is a cross-sectional view of a display module according to some embodiments of the inventive concept.

FIG. 4A is an enlarged plan view of a display panel according to some embodiments of the inventive concept. FIG. 4B is a cross-sectional view of a display module according to some embodiments of the inventive concept. FIG. 4B illustrates a cross-section taken along the cut-line I-I' shown in FIG. 4A.

Referring to FIG. 4A, each of the pixels PXnm (see FIG. 3A) of the display panel DP may include sub-pixels. FIG. 4A illustrates some pixels $PX_{11}$, $PX_{12}$, $PX_{21}$, and $PX_{22}$ among the pixels PXnm (see FIG. 3A), and hereinafter, each configuration of the pixels $PX_{11}$, $PX_{12}$, $PX_{21}$, and $PX_{22}$ will be described on the basis of a single pixel $PX_{11}$ (hereinafter, referred to as a pixel), which may be equally applied to other pixels. Meanwhile, the distance between adjacent two pixels $PX_{11}$ and $PX_{12}$ along the first direction may be defined as a first distance P1. The first distance P1 may be defined as a reference distance between the adjacent two pixels $PX_{11}$ and $PX_{12}$, for example, the distance from the end of a first light emitting region $PXA_{a11}$ of one pixel $PX_{11}$ to the end of a first light emitting region $PXA_{a12}$ of another pixel $PX_{12}$.

The light emitting element of the pixel $PX_{11}$ may include pixel electrodes AE1, AE2, and AE3 located on the base substrate BS (see FIG. 2). The pixel electrodes AE1, AE2, and AE3 may be arranged to be spaced apart from each other on a plane (e.g., when viewed from the third direction DR3, or in a plan view). Each of the pixel electrodes AE1, AE2, and AE3 included in the single pixel $PX_{11}$ may correspond to sub-pixels constituting the pixel $PX_{11}$.

A pixel defining film PDL may be located on the pixel electrodes AE1, AE2, and AE3. The pixel defining film PDL may correspond to each of the pixel electrodes AE1, AE2, and AE3, and emission openings $OP_{a11}$, $OP_{b11}$, and $OP_{c11}$ may be defined which expose at least a portion of the pixel electrodes AE1, AE2, and AE3.

The display region DA of the display panel DP may be divided into light emitting regions corresponding to sub-pixels and a non-light emitting region NPXA surrounding the light emitting regions. FIG. 4A illustrates light emitting regions $PXA_{a11}$, $PXA_{b11}$, $PXA_{c11}$, $PXA_{a12}$, $PXA_{b12}$, $PXA_{c12}$, $PXA_{a21}$, $PXA_{b21}$, $PXA_{c21}$, $PXA_{a22}$, $PXA_{b22}$, and $PXA_{c22}$ included in each of some pixels $PX_{11}$, $PX_{12}$, $PX_{21}$, and $PX_{22}$. Hereinafter, the light emitting regions $PXA_{a11}$, $PXA_{b11}$, and $PXA_{c11}$ included in the single pixel $PX_{11}$ will be described on the basis of the single pixel $PX_{11}$.

The pixel defining film PDL may define the light emitting regions $PXA_{a11}$, $PXA_{b11}$, and $PXA_{c11}$ and the non-light emitting region NPXA. Regions of the pixel electrodes AE1, AE2, and AE3 exposed by the emission openings $OP_{a11}$, $OP_{b11}$, and $OP_{c11}$ of the pixel defining film PDL may be defined as the light emitting regions $PXA_{a11}$, $PXA_{b11}$, and $PXA_{c11}$, and a region that does not overlap the emission openings $OP_{a11}$, $OP_{b11}$, and $OP_{c11}$ of the pixel defining film PDL may be defined as the non-light emitting region NPXA.

The light emitting regions $PXA_{a11}$, $PXA_{b11}$, and $PXA_{c11}$ may be spaced apart from each other with the non-light emitting region NPXA located therebetween. The light emitting regions $PXA_{a11}$, $PXA_{b11}$, and $PXA_{c11}$ may correspond to regions in which light provided from the light emitting element of the pixel $PX_{11}$ is emitted.

The light emitting regions $PXA_{a11}$, $PXA_{b11}$, and $PXA_{c11}$ included in the single pixel $PX_{11}$ may include the first light emitting region $PXA_{a11}$, a second light emitting region $PXA_{b11}$, and a third light emitting region $PXA_{c11}$. The first to third light emitting regions $PXA_{a11}$, $PXA_{b11}$, and $PXA_{c11}$ may be divided according to colors of light emitted toward the outside of the electronic device ED.

The first light emitting region $PXA_{a11}$ may correspond to a region configured to provide first color light, the second light emitting region $PXA_{b11}$ may correspond to a region configured to provide second color light, and the third light emitting region $PXA_{c11}$ may correspond to a region configured to provide third color light. According to some embodiments, the first to third color lights may have different colors. For example, the first color light may be green light, the second color light may be red light, and the third color light may be blue light. However, the embodiments of the inventive concept are not limited thereto.

The non-light emitting region NPXA may set a boundary between the first to third light emitting regions $PXA_{a11}$, $PXA_{b11}$, and $PXA_{c11}$ and prevent color mixing between the first to third light emitting regions $PXA_{a11}$, $PXA_{b11}$, and $PXA_{c11}$.

The first to third light emitting regions $PXA_{a11}$, $PXA_{b11}$, and $PXA_{c11}$ may have a certain arrangement in the display region DA. The second light emitting region $PXA_{b11}$ and the third light emitting region $PXA_{c11}$ may be arranged along the first direction DR1 on a plane. The center of second light emitting region $PXA_{b11}$ and the center of third light emitting region $PXA_{c11}$ may be arranged to be parallel to the first direction DR1. The first light emitting region $PXA_{a11}$ may be located between the second light emitting region $PXA_{b11}$ and the third light emitting region $PXA_{c11}$ on a plane.

Meanwhile, the arrangement form of the first to third light emitting regions $PXA_{a11}$, $PXA_{b11}$, and $PXA_{c11}$ illustrated in FIG. 4 is an example, but embodiments according to the present disclosure are not limited thereto, and the arrangement configuration of the light emitting regions may vary according to design of the electronic device ED.

The first to third light emitting regions $PXA_{a11}$, $PXA_{b11}$, and $PXA_{c11}$ may have a rectangular shape on a plane. Each of the first to third light emitting regions $PXA_{a11}$, $PXA_{b11}$, and $PXA_{c11}$ may have a rectangular shape in different sizes. The shape and area of the first to third light emitting regions $PXA_{a11}$, $PXA_{b11}$, and $PXA_{c11}$ may be designed considering light output efficiency of color light emitted through the regions, and are not limited to the embodiments illustrated in FIG. 4. For example, each of the first to third light emitting regions $PXA_{a11}$, $PXA_{b11}$, and $PXA_{c11}$ may have a polygonal shape or a circular shape.

Alternatively, each of the first to third light emitting regions $PXA_{a11}$, $PXA_{b11}$, and $PXA_{c11}$ may have a rectangular shape with rounded corners. Alternatively, some of the first to third light emitting regions $PXA_{a11}$, $PXA_{b11}$, and $PXA_{c11}$ may have a diamond shape and others may have an octagonal shape, and the embodiments of the inventive concept are not limited thereto, and the first to third light emitting regions $PXA_{a11}$, $PXA_{b11}$, and $PXA_{c11}$ may have the same size and shape as each other.

The display panel DP may be located on the base substrate BS (see FIG. 2), and may include an auxiliary line EL in which the second voltage ELVSS (see FIG. 3B) is applied. The auxiliary line EL may be arranged to overlap the non-light emitting region NPXA. The auxiliary line EL may be located on a layer different from the pixel electrodes AE1, AE2, and AE3. However, the embodiments of the inventive concept are not limited thereto, and the auxiliary line EL may be located on the same layer as the pixel electrodes AE1, AE2, and AE3.

The auxiliary line EL may have a line shape extending along the first direction DR1 or the second direction DR2, and may have a lattice shape surrounding the pixel electrodes constituting the single pixel. The auxiliary line EL may have various shapes according to various embodiments as long as it is capable of supplying the second voltage to each of the pixels PXnm (see FIG. 3A).

The display panel DP may be located on the base substrate BS (see FIG. 2), and may include an auxiliary electrode SE which is electrically connected to the auxiliary line EL. According to some embodiments, the auxiliary electrode SE may be located on a layer different from the layer of the auxiliary line EL, and may be connected to the auxiliary line EL through a contact hole. At least a portion of the auxiliary electrode SE may be exposed by an opening S-OP defined in the pixel defining film PDL. The auxiliary electrode SE at least a portion of which is exposed may be electrically connected to a counter electrode of the light emitting element, and may apply the second voltage ELVSS (see FIG. 3B) to the counter electrode.

The auxiliary line SE may receive a voltage different from the pixel electrodes AE1, AE2, and AE3. According to some embodiments, the pixel electrodes AE1, AE2, and AE3 may receive the first voltage ELVDD (see FIG. 3B) and the auxiliary electrode SE may receive the second voltage ELVSS (see FIG. 3B).

The auxiliary electrode SE may be arranged to be spaced apart from the pixel electrodes AE1, AE2, and AE3 on a plane. According to some embodiments, the auxiliary electrode SE may be arranged to be spaced apart from the pixel electrodes AE1, AE2, and AE3 on the same layer.

The auxiliary electrode SE may have an island shape spaced apart from the pixel electrodes AE1, AE2, and AE3. However, the embodiments of the inventive concept are not limited thereto, and the auxiliary electrode SE may have a line shape along one direction as the auxiliary line EL. The auxiliary electrode SE illustrated in FIG. 4 is schematically illustrated for convenience of description, and the shape, area, etc. of the auxiliary electrode SE may vary according to design. For example, the auxiliary electrode SE may have a rectangular shape on a plane as illustrated in FIG. 4A, or may have a circular shape. The opening S-OP defined in the pixel defining film PDL may have a shape corresponding to the shape of the auxiliary electrode SE.

The auxiliary electrode SE may be arranged corresponding to each of the pixels $PX_{11}$, $PX_{12}$, $PX_{21}$, and $PX_{22}$ as illustrated in FIG. 4A. However, the embodiments of the inventive concept are not limited thereto, and one auxiliary electrode SE may be formed or arranged for a plurality of pixels, or one for each sub-pixel, and the arrangement design of the auxiliary electrode SE may vary.

Referring to FIGS. 4A and 4B, the display module DM according to some embodiments may include a base substrate BS, a circuit layer DP-CL located on the base substrate BS, a display element layer DP-LED on the circuit layer DP-CL, and an encapsulation layer TFE1 located on the display element layer DP-LED. Meanwhile, the base substrate BS, the circuit layer DP-CL, the display element layer DP-LED, and the encapsulation layer TFE1 may be the components of the display panel DP as described in FIG. 2.

The base substrate BS may include a glass substrate, a metal substrate, a polymer substrate, or an organic/inorganic composite material substrate. The base substrate BS may have a single-layer structure or a multi-layer structure. For example, the base substrate BS with a multi-layer structure may include synthetic resin layers and at least one inorganic layer located between the synthetic resin layers.

The synthetic resin layer of the base substrate BS may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, a perylene-based resin, or a polyimide-based resin. However, the material of the synthetic resin layer of the base substrate BS is not limited to the above examples.

The circuit layer DP-CL is located on the base substrate BS. The circuit layer DP-CL may include a transistor T1 as a circuit element. The configuration of the circuit layer DP-CL may vary according to the design of the driving circuit of the pixels PX11 to PXnm (see FIG. 3A), and FIG. 4B illustrates an example of the driving transistor T1. The arrangement relationship of an active A1, a source S1, a drain D1, and a gate G1 constituting the transistor T1 is illustrated as an example. The active A1, the source S1, and the drain D1 may be regions that are divided according to a doping concentration or conductivity of a semiconductor pattern.

The circuit layer DP-CL may include a buffer layer 10, a first insulating layer 20, a second insulating layer 30, and a third insulating layer 40 located on the base substrate BS. For example, the buffer layer 10, the first insulating layer 20, and the second insulating layer 30 may be inorganic layers, and the third insulating layer 40 may be an organic layer.

The display element layer DP-LED may include the light emitting element OLED as a display element. The light emitting element OLED may generate the above-described source light. The light emitting element OLED includes a first electrode AE, a second electrode CE, and an emission layer EML located therebetween. According to some embodiments, the display element layer DP-LED may include an organic light emitting diode as a light emitting element. According to some embodiments of the inventive concept, the light emitting element may include a quantum dot light emitting diode. That is, the emission layer EML included in the light emitting element OLED may include an organic light emitting material as a light emitting material, or the emission layer EML may include a quantum dot as a light emitting material. Alternatively, according to some embodiments, the display element layer DP-LED may include an ultra-small light emitting element as a light emitting element. The ultra-small light emitting element, for example, may include a micro LED element and/or a nano LED element. The length and width of the ultra-small light emitting element may be between several hundred nanometers and several hundred micrometers.

The display element layer DP-LED includes a pixel defining film PDL. For example, the pixel defining film PDL may be an organic layer. At least a portion of the light emitting element OLED may be located in a first opening OH defined in the pixel defining film PDL.

The first electrode AE is located on the third insulation layer 40. The first electrode AE may be directly or indirectly connected to the transistor T1. The first opening OH is defined in the pixel defining film PDL. The first opening OH of the pixel defining film PDL exposes at least a portion of the first electrode AE. According to some embodiments, the first opening OH may be defined in the first light emitting region $PXA_{a11}$.

Referring to FIGS. 4A and 4B together, a hole control layer HCL, the emission layer EML, and an electron control layer ECL at least overlap the light emitting region $PXA_{a11}$. The hole control layer HCL, the emission layer EML, the electron control layer ECL, and a second electrode CE may be arranged in common in the first to third light emitting regions $PXA_{a11}$, $PXA_{b11}$, and $PXA_{c11}$. Each of the hole control layer HCL, the emission layer EML, the electron control layer ECL, and the second electrode CE, which overlap the first to third light emitting regions $PXA_{a11}$, $PXA_{b11}$, and $PXA_{c11}$, may have an integrated shape. However, the embodiments of the inventive concept are not limited thereto, and at least one of the hole control layer HCL, the emission layer EML, or the electron control layer ECL may be formed separately in each of the first to third light emitting regions $PXA_{a11}$, $PXA_{b11}$, and $PXA_{c11}$.

The hole control layer HCL may include a hole transport layer and further include a hole injection layer. The emission layer EML may generate blue light that is source light. The blue light may include light having a wavelength of about 410 nm to about 480 nm. The emission spectrum of blue light may have a maximum peak in about 440 nm to about 460 nm. The electron control layer ECL may include an electron transport layer and may further include an electron injection layer.

The encapsulation layer TFE1 that protects the second electrode CE may be located on the display element layer DP-LED. The encapsulation layer TFE1 may include an organic material or inorganic material. The encapsulation layer TFE1 may have a multi-layer structure in which an inorganic layer/organic layer is alternately placed. According to some embodiments, the encapsulation layer TFE1 may include a first inorganic encapsulation layer IOL1/ organic encapsulation layer TOL/second inorganic encapsulation layer IOL2. The first and second inorganic encapsulation layer IOL1 and IOL2 may protect the light emitting element OLED from external moisture, and the organic encapsulation layer TOL may prevent pit defect of the light emitting element OLED caused by introduced foreign substances or contaminants during a manufacture process. According to some embodiments, the display panel DP may further include, above the encapsulation layer TFE1, a refractive index control layer for improving light output efficiency.

As illustrated in FIG. 4B, the light control member LCM is located on the encapsulation layer TFE1. The light control member LCM may include a light control layer CCL, a color filter layer CFL, and a base layer BL.

The light control layer CCL may be located on the display element layer DP-LED including the light emitting element LED. The light control layer CCL may include a bank BMP, a light control pattern CCP-G, and barrier layers CAP1 and CAP2.

The bank BMP may include a base resin and an additive. The base resin may be formed of various resin compositions, which may be generally referred to as a binder. The additive may include a coupling agent and/or photoinitiator. The additive may further include a dispersant.

The bank BMP may include a black coloring agent for shielding light. The bank BMP may include a black pigment and black dye mixed in the base resin. According to some embodiments, the black component may include carbon black or a metal such as chromium, or an oxide thereof.

The bank BMP includes a second opening BW-OH corresponding to the first opening OH. On a plane, the second opening BW-OH overlaps the first opening OH, and has an area greater than that of the first opening OH.

The light control pattern CCP-G is located inside the second opening BW-OH. The light control pattern CCP-G may convert the optical properties of the source light. The light control pattern CCP-G may include a quantum dot for converting the optical properties of the source light.

The light control pattern CCP-G may include a quantum dot that converts the source light into light having a different wavelength. The quantum dot included in the light control pattern CCP-G overlapping the first light emitting region $PXA_{a11}$ (see FIG. 4A) may convert blue light that is the source light into green light.

The quantum dot may have a core-shell structure, and the core of the quantum dot may be selected from among a Group II-VI compound, a Group III-VI compound, a Group I-III-IV compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

The Group I-III-VI compound may be selected from a ternary compound selected from the group consisting of $AgInS$, $AgInS_2$, $CuInS$, $CuInS_2$, $AgGaS_2$, $CuGaS_2$ $CuGaO_2$, $AgGaO_2$, $AgAlO_2$, and a mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. Meanwhile, the Group III-V compound may further include a Group II metal. For example, InZnP, InGaZnP, InAlZnP, etc. may be include as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, or a quaternary compound may be present in a particle with a uniform concentration distribution, or may be present in the same particle with a partially different concentration. In addition, a core-shell structure in which one quantum dot surrounds another quantum dot may be possible. In the core-shell structure, the interface of the shell may have a concentration gradient in which the concentration of an element present in the shell becomes lower towards the core.

In some embodiments, the quantum dot may have the above-described core-shell structure including a core containing nanocrystals and a shell surrounding the core. The shell of the quantum dot may serve as a protection layer to prevent or reduce the chemical deformation of the core for maintaining semiconductor properties, and/or a charging layer for imparting electrophoresis properties to the quantum dot. The shell may be a single layer or a multilayer. An example of the shell of the quantum dot may include a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound such as $MgAl_2O_4$, $CoFe_2O_4$, $NiFe_2O_4$, or $CoMn_2O_4$, but the embodiments of the inventive concept are not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiments of the inventive concept are not limited thereto.

The quantum dot may have a full width of half maximum (FWHM) of a light emission wavelength spectrum of about 45 nm or less, for example, about 40 nm or less, and for example, about 30 nm or less, and color purity or color reproducibility may be improved in the above range. In addition, light emitted through such a quantum dot is emitted in all directions, and thus a wide viewing angle may be improved.

In addition, although the form of a quantum dot is not particularly limited as long as it is a form commonly used in the art, for example, a quantum dot in the form of spherical, pyramidal, multi-arm, or cubic nanoparticles, nanotubes, nanowires, nanofibers, nanoparticles, etc. may be used.

The quantum dot may control the color of emitted light according to the particle size thereof, and thus, the quantum dot may have various emission colors such as blue, red, and green. According to some embodiments, the quantum dot included in the light control pattern CCP-G overlapping the first light emitting region $PXA_{a11}$ (see FIG. 4B) may have a green light emission color. The smaller the particle size of the quantum dot becomes, light in the short wavelength region may be emitted. For example, in the quantum dot having the same core, the particle size of a quantum dot emitting green light may be smaller than that of a quantum dot emitting red light. In addition, in the quantum dot having the same core, the particle size of a quantum dot emitting blue light may be smaller than that of a quantum dot emitting green light. However, the embodiments of the inventive concept are not limited thereto, and even in the quantum dot having the same core, the particle size may be adjusted according to forming-materials and thickness of a shell.

Meanwhile, when the quantum dot has various light emission colors such as blue, red, and green, the quantum dot having a different light emission color may have a different core material.

The light control pattern CCP-G may further include a scatterer. The light control pattern CCP-G may include a quantum dot that converts the blue light into the green light, and the scatterer that scatters light.

The scatterer may be inorganic particles. For example, the scatterer may include at least one of $TiO_2$, ZnO, $Al_2O_3$, $SiO_2$, or hollow sphere silica. The scatterer may include any one among $TiO_2$, ZnO, $Al_2O_3$, $SiO_2$, and hollow sphere silica, or may be a mixture of at least two materials selected from among $TiO_2$, ZnO, $Al_2O_3$, $SiO_2$, and hollow sphere silica.

The light control pattern CCP-G may include a base resin in which the quantum dots and the scatterer are dispersed. The base resin is a medium in which the quantum dots and the scatterer are dispersed, and may be composed of various resin compositions that may be generally referred to as a binder. For example, the base resin may be an acrylic-based resin, a urethane-based resin, a silicone-based resin, an epoxy-based resin, etc. The base resin may be a transparent resin.

According to some embodiments, the light control pattern CCP-G may be formed of an inkjet process. A liquid composition is provided in the second opening BW-OH. A composition polymerized by a thermo-curing process or a photo-curing process has a decrease in volume after being cured.

A height difference between the top surface of the bank BMP and the top surface of the light control pattern CCP-G may occur. That is, the top surface of the bank BMP may be defined to be higher than the top surface of the light control pattern CCP-G. The height difference between the top surface of the bank BMP and the top surface of the light control pattern CCP-G may be, for example, about 2 μm to about 3 μm.

The light control layer CCL may further include barrier layers CAP1 and CAP2 located on at least one of the upper portion or the lower portion of the light control pattern CCP-G. The barrier layers CAP1 and CAP2 may serve to prevent or reduce the penetration of moisture and/or oxygen (or other contaminants) (hereinafter, referred to as 'moisture/oxygen'). The barrier layers CAP1 and CAP2 may be located on the upper portion and lower portion of the light control pattern CCP-G to prevent the light control patterns CCP-G from being exposed to moisture/oxygen.

The barrier layers may include a first barrier layer adjacent to the display element layer DP-LED and a second barrier layer CAP2 spaced apart from the display element layer DP-LED with the light control pattern CCP-G located therebetween. The first barrier layer CAP1 may cover one surface of the light control pattern CCP-G, which is adjacent to the display element layer DP-LED, and the second barrier layer CAP2 may cover the other surface of the light control pattern CCP-G, which is adjacent to the color filter layer CFL. In addition, the barrier layers CAP1 and CAP2 may cover the bank BMP as well as the light control pattern CCP-G.

The first barrier layer CAP1 may be arrange to follow the height difference between the bank BMP and the light control pattern CCP-G. The second barrier layer CAP2 may cover one surface of the bank BMP and one surface of the light control pattern CCP-G which are adjacent to the color filter layer CFL. The second barrier layer CAP2 may be directly located on the lower portion of a low refractive layer LR.

The barrier layers CAP1 and CAP2 may include at least one inorganic layer. That is, the barrier layers CAP1 and CAP2 may include an inorganic material. For example, the barrier layer CAP1, CAP2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride, or a metal thin film which secures a light transmittance. For example, the first barrier layer CAP1 located on the lower portion of the light control pattern CCP-G may include the silicon oxynitride, and the second barrier layer CAP2 located on the upper portion of the light control pattern CCP-G may include the silicon oxide. However, the embodiments of the inventive concept are not limited thereto. Meanwhile, the barrier layers CAP1 and CAP2 may further include an organic film. The barrier layers CAP1 and CAP2 may be formed of a single layer or a plurality of layers. In the barrier layers CAP1 and CAP2, the inorganic film may be to protect the light control pattern CCP-G from external moisture, and the organic film may be to remove the height differences defined by the bank BMP and the light control pattern CCP-G and provide a flat base surface for a member to be located thereabove.

The color filter layer CFL is located on the light control layer CCL. The color filter layer CFL includes at least one among color filters CF1, CF2, and CF3. The color filters CF1, CF2, and CF3 each transmit light having a specific wavelength range and block light other than the specific wavelength range. A first color filter CF1 of the first light emitting region $PXA_{a11}$ may transmit green light, and block red light and blue light.

The first color filter CF1 may include a base resin, and dye and/or pigment dispersed in the base resin. The base resin is a medium in which dye and/or pigment is dispersed, and may be composed of various resin compositions that may be generally referred to as a binder.

The first color filter CF1 may have a uniform thickness in the first light emitting region $PXA_{a11}$. The light converted from the source light including blue light into red light through the light control pattern CCP-G may be provided for the outside with uniform brightness in the first light emitting region $PXA_{a11}$.

The color filter layer CFL may include the low refractive layer LR. The low refractive layer LR may be located between the light control layer CCL and the first color filter CF1. The low refractive layer LR may be located on the upper portion of the light control layer CCL to block the light control pattern CCP-G from being exposed to moisture/oxygen. In addition, the low refractive layer LR may be located between the light control pattern CCP-G and the first color filter CF1 or may serve as an optical functional layer, for example, increasing light extraction efficiency or preventing reflected light from being incident to the light control layer CCL. The low refractive layer LR may have a refractive index lower than an adjacent layer.

The low refractive layer LR may be a layer having a low refractive index, which may be a mixed layer of an organic material and an inorganic material. According to some embodiments, the low refractive layer LR may include a polymer resin, and inorganic particles may be dispersed in the polymer resin. The polymer resin included in the low refractive layer LR may be, for example, a silicone resin and/or acrylic silicone resin. The inorganic particles included in the low refractive layer LR may be, for example, hollow sphere silica and/or porogen. However, the embodiments of the inventive concept are not limited thereto, and the low refractive layer LR may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride, or a metal thin film which secures a light transmittance. The low refractive layer LR may be formed of a single layer or a plurality of layers.

The low refractive layer LR may have a low refractive index of about 1.3 or less. According to some embodiments, the refractive index of the low refractive layer LR may be about 1.2. The low refractive layer LR may have a refractive index of about 1.3 or less in a wavelength range of about 400 nm to about 700 nm, which is in a visible light range.

Meanwhile, in the display device DD according to some embodiments, the first color filter CF1 of the color filter layer CFL may be directly located on the light control layer CCL. In this case, the low refractive layer LR may be omitted.

According to some embodiments, the display panel DP may further include a base layer BL located on the color filter layer CFL. The base layer BL may be a member that provides a reference surface on which the color filter layer CFL, the light control layer CCL, etc. are located. The base layer BL may be a glass substrate, a metal substrate, a plastic substrate, etc. However, the embodiments are not limited thereto, and the base layer BL may be an inorganic layer, an organic layer, or a composite material layer. In addition, unlike the configuration illustrated, according to some embodiments, the base layer BL may be omitted.

The display panel DP according to some embodiments may include a lower panel including the display element layer DP-LED and an upper panel (an optical structure layer OSL) including the color filter layer CFL, and according to some embodiments, a filling layer FML may be located between the lower panel and the upper panel OSL. According to some embodiments, the filling layer FML may fill a space between the display element layer DP-LED and the light control layer CCL. The filling layer Fml may be directly located on the encapsulation layer TFE1, and the first barrier layer CAP1 included in the light control layer CCL may be directly located on the filling layer FML. The bottom surface of the filling layer FML may be in contact with the top surface of the encapsulation layer TFE1, and the top surface of the filling layer FML may be in contact with the bottom surface of the first barrier layer CAP1.

The filling layer FML may serve as a buffer between the display element layer DP-LED and the light control layer CCL. According to some embodiments, the filling layer FML may function to absorb an impact, and may increase the strength of the display panel DP. The filling layer FML may be formed of a filling resin including a polymer resin. For example, the filling layer FML may be formed of a filling layer resin including an acrylic-based resin, an epoxy-based resin, or the like.

The filling layer FML may be separately formed in a separate process to have a configuration different from the encapsulation layer TFE1 located on the lower portion thereof and the first barrier layer CAP1 located on the upper portion thereof. Meanwhile, the filling layer FML may be formed of a different material from each of the encapsulation layer TFE1 and the barrier layer CAP1.

Figure 5:
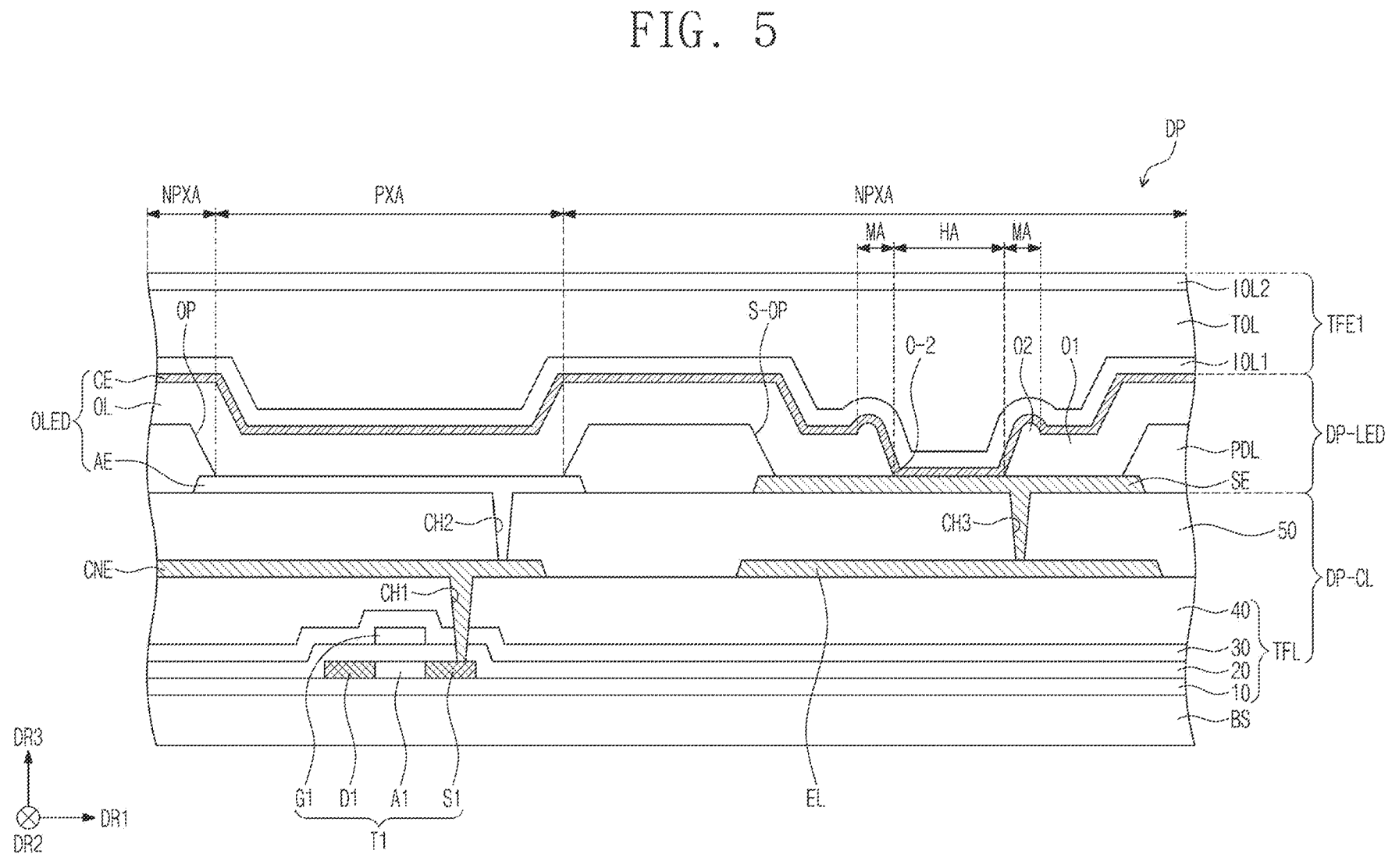
Figure 6:
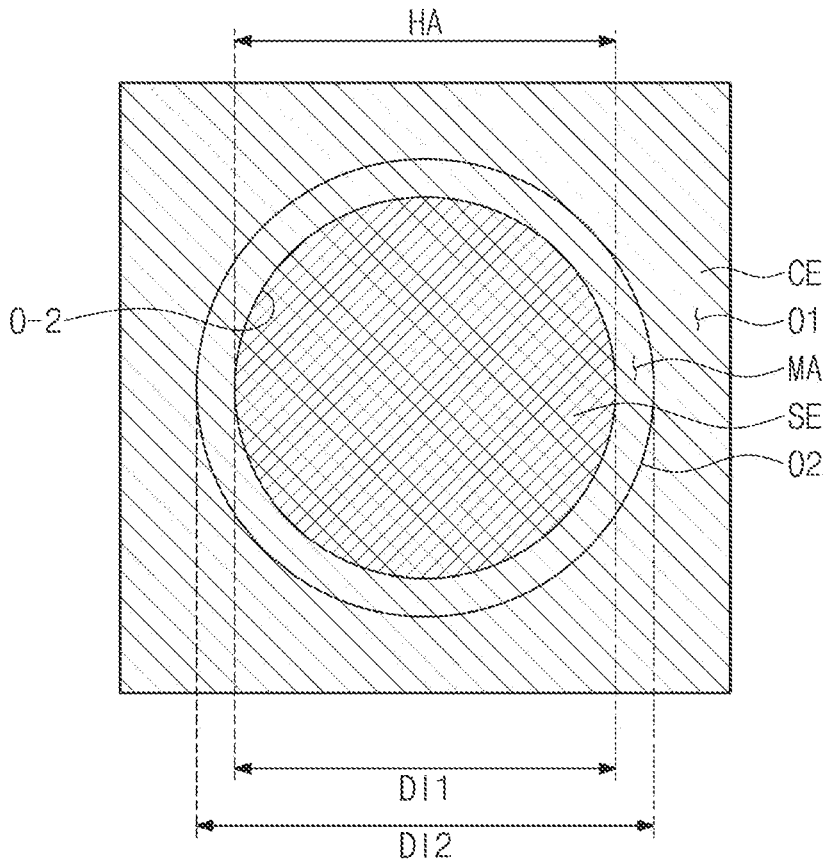
FIG. 6 is a plan view of a display panel corresponding to a hole region according to some embodiments of the inventive concept.
Figure 6:
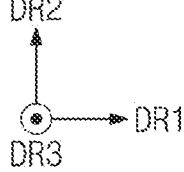
Figure 7A:
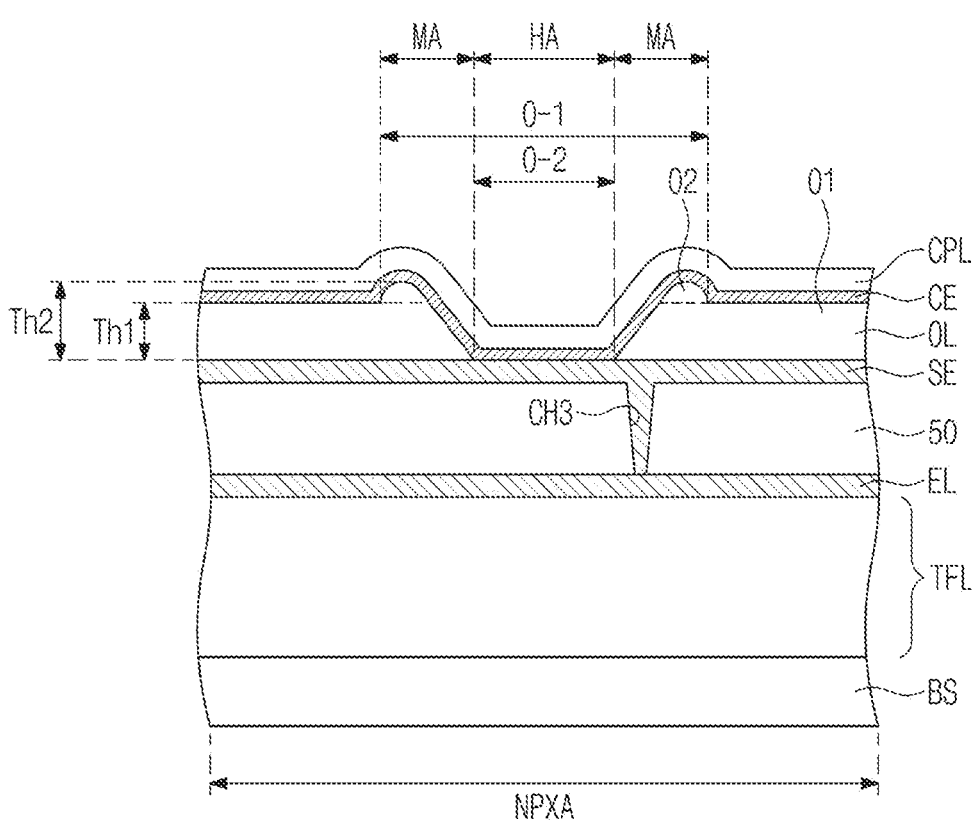
FIGS. 7A and 7B are cross-sectional views illustrating a display panel corresponding to a hole region according to some embodiments of the present invention.
Figure 7A:
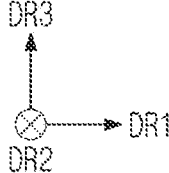
Figure 7B:
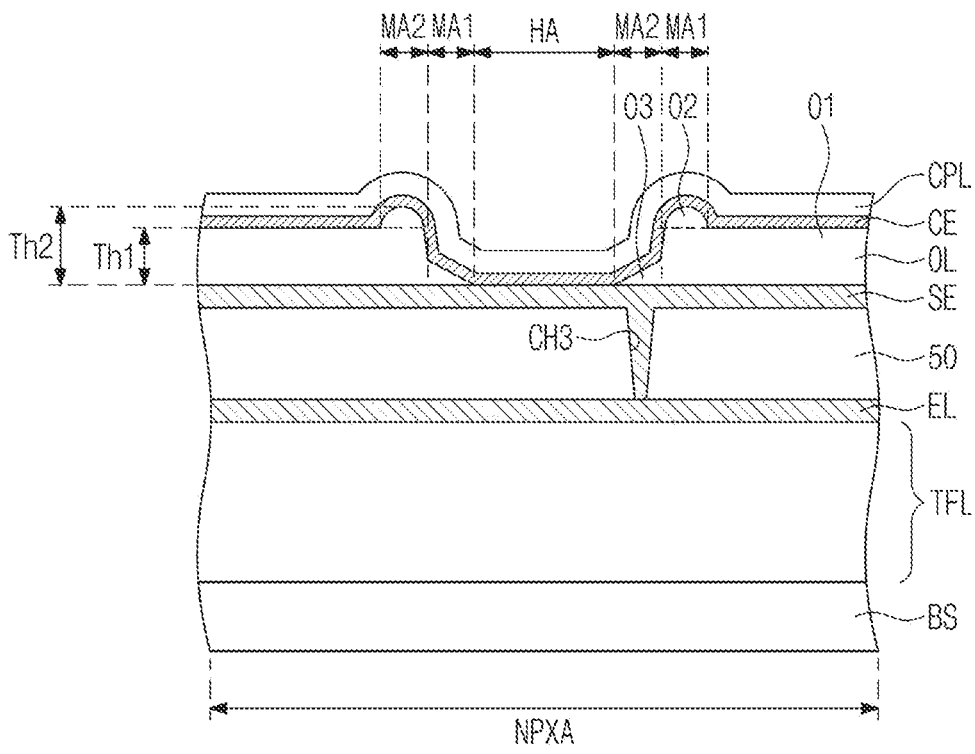
Figure 7B:
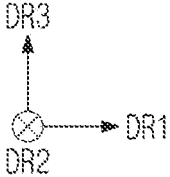

FIG. 5 is a cross-sectional view of a display panel according to some embodiments of the inventive concept. FIG. 6 is a plan view of a display panel corresponding to a hole region according to some embodiments of the inventive concept. FIGS. 7A and 7B are cross-sectional views illustrating a display panel corresponding to a hole region according to some embodiments of the present invention.

Referring to FIG. 5, the display panel DP may include the base substrate BS, the circuit layer DP-CL, the display element layer DP-LED, and the encapsulation layer TFE1, and the above description may be equally applied. FIG. 5 illustrates a cross-section of the light emitting element OLED corresponding to the single light emitting region PXA among the above-described light emitting regions and the auxiliary electrode SE adjacent to the light emitting element OLED.

The display panel DP may include insulating layers, a semiconductor pattern, a conductive pattern, a signal line, and the like. In the manufacturing of the display panel DP, the insulating layer, the semiconductor layer, and the conductive layer may be formed on the base substrate BS by a method such as coating or deposition. Then, the insulating layer, the semiconductor layer, and the conductive layer may be optionally patterned by a photolithography method. Through this process, the semiconductor pattern, the conductive pattern, the signal line, etc. included in the circuit layer DP-CL may be formed. The semiconductor pattern of the circuit layer DP-CL may be arranged across pixels according to a preset rule.

At least one inorganic layer may be located on the top surface of the base substrate BS. The inorganic layer may constitute the barrier layer and/or the buffer layer. FIG. 5 illustrates the inorganic layer defined as the buffer layer 10.

The buffer layer 10 may improve a bonding force between the base substrate BS and the semiconductor pattern of the circuit layer DP-CL. The buffer layer 10 may include at least one of an aluminum oxide, a titanium oxide, a silicon oxide, a silicon nitride, a silicon oxynitride, a zirconium oxide, or a hafnium oxide, and the embodiments of the inventive concept are not limited thereto.

The semiconductor pattern of the circuit layer DP-CL may be located on the buffer layer 10. The semiconductor pattern may include polysilicon. However, the embodiments of the inventive concept are not limited thereto, and the semiconductor pattern may include amorphous silicon or a metal oxide.

The source S1, the active A1, and the drain D1 of the transistor T1 may be formed from the semiconductor pattern. The semiconductor pattern of the transistor T1 may be divided into a plurality of regions according to a degree of conductivity. A region of the semiconductor pattern, which is doped with a relatively high concentration to thus have relatively high conductivity, may serve as an electrode or a signal line, and may correspond to the source S1 or the drain D1 of the transistor T1. A region of the semiconductor pattern, which is not doped, or doped with a relatively low concentration, or not reduced, may have relatively low conductivity, and the region may correspond to the active A1 of the transistor T1.

The circuit layer DP-CL may include a plurality of transistors and a plurality of insulating layers constituting the pixel circuit PC (see FIG. 3B). FIG. 5 illustrates a first transistor T1 and the first to fourth insulating layers 20, 30, 40, and 50.

The first to fourth insulating layers 20, 30, 40, and 50 may be located on the buffer layer 10. The first to fourth insulating layers 20, 30, 40, and 50 may include an inorganic layer or organic layer, and may have a single-layer structure or a multi-layer structure.

The inorganic layer may include at least one of an aluminum oxide, a titanium oxide, a silicon oxide, a silicon nitride, a silicon oxynitride, a zirconium oxide, or a hafnium oxide, but the embodiments of the inventive concept are not limited thereto. The organic layer may include a phenol-based polymer, an acrylic-based polymer, an imide-based polymer, an aryl ether-based polymer, an amide-based polymer, a fluorine-based polymer, a p-xylene-based polymer, a vinyl alcohol-based polymer, and a combination thereof, but the embodiments of the inventive concept are not limited thereto.

The first insulating layer 20 may cover the semiconductor pattern of the circuit layer DP-CL. The gate G1 of the first transistor T1 may be located on the first insulating layer 20. The gate G1 may be a portion of the conductive pattern. The gate G1 may overlap the active A1. The gate G1 may serve as a mask in the process of doping the semiconductor pattern. The second insulating layer 30 may be located on the first insulating layer 20 and cover the gate G1. The third insulating layer 40 may be located on the second insulating layer 30.

Meanwhile, the buffer layer 10, the first to third insulating layers 20, 30, and 40, and a layer including the transistor (e.g., the first transistor T1 in FIG. 5) formed between the insulating layers may be defined as a transistor layer TFL.

A connection electrode CNE may be located between the first transistor T1 and the light emitting element OLED to connect the first transistor T1 and the light emitting element OLED. The connection electrode CNE may be located on the third insulating layer 40 and may be connected to the source S1 of the transistor T1 through a first contact hole CH1 passing through the first and second insulating layers 20 and 30.

The auxiliary line EL may be located on the third insulating layer 40. According to some embodiments, the auxiliary line EL may be located on the same layer as the connection electrode CNE. The auxiliary line EL may be electrically connected to a power line, for which the second voltage ELVSS (see FIG. 3B) is provided, to provide the second voltage.

The fourth insulating layer 50 may be located on the third insulating layer 40. The fourth insulating layer 50 may cover the connection electrode CNE and the auxiliary line EL. According to some embodiments, the fourth insulating layer 50 may include an organic layer. The fourth insulating layer 50 including the inorganic layer may provide a flat top surface. However, the embodiments of the inventive concept are not limited thereto.

The display element layer DP-LED may be located on the circuit layer DP-CL. The display element layer DP-LED may include a plurality of light emitting elements OLED (see FIG. 4B) and a pixel defining film PDL, and FIG. 5 illustrates a cross-section corresponding to the single light emitting element OLED. The light emitting element OLED may include a first electrode AE (or a pixel electrode), an organic layer OL, and a second electrode CE (or an opposite electrode). Here, the first electrode AE may correspond to any one among the above-described pixel electrodes AE1, AE2, and AE3.

The first electrode AE may be located in a first region on the base substrate BS. According to some embodiments, the first electrode AE may be located on the fourth insulating layer 50 of the circuit layer DP-CL. The first electrode AE may be connected to the connection electrode CNE through a second contact hole CH2 passing through the fourth insulating layer 50. The first electrode AE may be connected to the first transistor T1 via the connection electrode CNE.

The pixel defining film PDL may be located on the fourth insulating layer 50. In the pixel defining film PDL, an emission opening OP for exposing a portion of the first electrode AE may be defined. The pixel defining film PDL may cover a portion of the first electrode AE. A portion of the first electrode AE exposed by the emission opening OP of the pixel defining film PDL may correspond to the light emitting region PXA.

The pixel defining film PDL may include an organic material. For example, the pixel defining film PDL may include a polyacrylate-based resin or a polyimide-based resin, but the material of the pixel defining film PDL is not limited to the above examples. Meanwhile, the pixel defining film PDL may formed of an inorganic material. For example, the pixel defining film PDL may include a silicon nitride (SiNx), a silicon oxide (SiOx), a silicon oxynitride (SiOxNy), etc., but the material of the pixel defining film PDL is not limited to the above examples.

The pixel defining film PDL may include a light absorbing material or have a certain color. For example, the pixel defining film PDL may include a base resin and a black pigment and/or black dye mixed in the base resin.

The organic layer OL may include the emission layer EML (see FIG. 4B) and a functional layer located between the first electrode AE and the second electrode CE, which face each other. The functional layer may include, for example, the hole control layer HCL (see FIG. 4B) and the electron control layer ECL (see FIG. 4B).

The second electrode CE may face the first electrode AE and may be located on the organic layer OL. The second electrode CE may be a common layer provided for the plurality of pixels in common, and overlap the light emitting region PXA and the non-light emitting region NPXA. A common voltage may be provided for the second electrode CE.

The second electrode CE may be formed to have light transmission properties. The second electrode CE may be a transflective electrode or a transmissive electrode. When the second electrode CE is provided as a transmissive electrode, the second electrode CE may include a transparent metal oxide, for example, indium tin oxide (ITO), indium zinc oxide (IZO), zinc oxide (ZnO), and indium tin zinc oxide (ITZO). When the second electrode CE is provided as a transflective electrode or a reflective electrode, the second electrode CE may include Ag, Mg, Cu, Al, Pt, Pd, Au, Ni, Nd, Ir, Cr, Li, Ca, LiF/Ca, LiF/Al, Mo, Ti, Yb, W, In, Zn, Sn, or a compound or mixture thereof (e.g., AgMg, AgYb, or MgAg). The embodiments of the inventive concept are not limited thereto, and the second electrode CE may have a multi-layer structure including a reflective film or a transflective film formed of the above-described materials, and a transparent conductive film formed of ITO, IZO, ZnO, ITZO, etc.

The second electrode CE may be deposited thin and formed to have light transmission properties. The second electrode CE may be provided to have a thickness no less than a certain thickness to prevent an IR drop phenomenon by bringing the second electrode CE into contact with the auxiliary electrode SE and emit light having uniform brightness, as described below. For example, the thickness of the second electrode CE may be about 50 Å to about 200 Å. If the thickness of the second electrode CE is less than about 50 Å, although the second electrode CE and the auxiliary electrode SE are brought into contact, the effect of preventing the IR drop phenomenon may not be achieved. If the thickness of the second electrode CE is greater than about 200 Å, the second electrode CE may have a decrease in light transmission properties, thereby reducing the luminous efficiency of the light emitting element.

The second electrode CE may have a low sheet resistance. According to some embodiments, the sheet resistance of the second electrode CE may be about 30Ω/□ or less. If the sheet resistance of the second electrode CE is greater than about 30Ω/□, although the second electrode CE and the auxiliary electrode SE are brought into contact, the effect of preventing the IR drop phenomenon may not be achieved.

The auxiliary electrode SE may be located in a second region on the base substrate BS. According to some embodiments, the auxiliary electrode SE may be located on the fourth insulating layer 50 of the circuit layer DP-CL. The auxiliary electrode SE may be connected to the auxiliary line EL through a third contact hole CH3 passing through the fourth insulating layer 50. The second voltage may be applied to the auxiliary electrode SE via the auxiliary line EL. However, the embodiments of the inventive concept are not limited thereto, and the auxiliary electrode SE may be directly connected to the power line that supplies the second voltage, and thus the second voltage may be applied to the auxiliary electrode SE.

The auxiliary electrode SE may be located on the same layer as the first electrode AE. The auxiliary electrode SE may be located in an island shape to be spaced apart from the first electrode AE on a plane. However, the embodiments of the inventive concept are not limited thereto, and the auxiliary electrode SE may be located in a line shape extending in one direction on a plane For example, the auxiliary electrode SE may be located in a line shape extending along the second direction which is an extending direction of the auxiliary line EL. The shape of the auxiliary electrode SE is not limited to any one embodiment as long as it is arranged to be spaced apart from the first electrode AE. As described above, the auxiliary electrode SE may have a rectangular shape or a circular shape on a plane.

According to some embodiments, functional layers and emission layer included in the organic layer OL may be provided as a common layer which overlaps the light emitting region PXA and the non-light emitting region NPXA and has an integrated shape. However, the embodiments of the inventive concept are not limited thereto, and some of the functional layers and emission layer included in the organic layer OL may be provided by being patterned inside the emission opening OP defined in the pixel defining film PDL. At least some of the functional layers and emission layer included in the organic layer OL may be provided inside the emission opening OP of the pixel defining film PDL to overlap the light emitting region PXA by being patterned through a method such as inkjet printing.

A portion of the organic layer OL may overlap the auxiliary electrode SE on a plane. An opening S-OP that exposes a portion of the auxiliary electrode SE may be defined in the pixel defining film PDL, and a portion of the organic layer OL may be located in the opening S-OP of the pixel defining film PDL overlapping the auxiliary electrode SE. Therefore, a portion of the organic layer OL may be located between the auxiliary electrode SE and the second electrode CE.

An opening O-2 that penetrates through the functional layers and the emission layer included in the organic layer OL and exposes a portion of the auxiliary electrode SE may be defined in the organic layer OL. A portion of the auxiliary electrode SE exposed by the opening O-2 of the organic layer OL may be defined as an opening region HA. The second electrode CE may be electrically connected to the auxiliary electrode SE through the opening region HA of the organic layer OL.

In order for the light generated from the emission layer included in the organic layer OL to pass through the second electrode CE and emit light toward the display surface IS (see FIG. 1A), the second electrode CE may be provided as an electrode having relatively high light transmittance. For example, the second electrode CE may be provided as a transparent electrode or a thin electrode. In this case, the resistance of the second electrode CE may increase, and thus the IR drop phenomenon may occur. However, the second electrode CE may be in contact with the auxiliary electrode SE, and thus the resistance of the second electrode CE may be reduced and the IR drop phenomenon may be prevented.

The organic layer OL may overlap a portion of the auxiliary electrode SE, and may include a first portion O1 having a flat top surface and a second portion O2 protruding from the first portion O1 toward the encapsulation layer TFE1. Hereinafter, the second portion O2 may be referred to as a protrusion O2. The protrusion O2 may be arranged adjacent to the opening O-2 formed in the organic layer OL.

The encapsulation layer TFE1 may be located on the display element layer DP-LED to seal the display element layer DP-LED. The encapsulation layer TFE1 may include an inorganic film and an organic film. FIG. 5 illustrates further details of the encapsulation layer TFE1 including the first and second inorganic encapsulation layers IOL1 and IOL2 and the organic encapsulation layer TOL located between the inorganic layers. The first inorganic encapsulation layer IOL1 may be located on the second electrode CE, and the organic encapsulation layer TOL and the second inorganic encapsulation layer IOL2 may be sequentially arranged on the first inorganic encapsulation layer IOL1.

The first and second inorganic encapsulation layers IOL1 and IOL2 may protect the light emitting elements OLED from moisture and/or oxygen. The first and second inorganic encapsulation layers IOL1 and IOL2 may include at least one of an aluminum oxide, a titanium oxide, a silicon oxide, a silicon nitride, a silicon oxynitride, a zirconium oxide, or a hafnium oxide, but the embodiments of the inventive concept are not limited thereto.

The organic encapsulation layer TOL may protect the light emitting element OLED from foreign substances such as dust particles. The organic encapsulation layer TOL may include an acrylic-based resin, but the embodiments of the inventive concept are not limited thereto.

FIG. 6 schematically illustrates a plan view of the auxiliary electrode SE and the second electrode CE which are in contact with each other through the opening region HA. FIGS. 7A and 7B schematically illustrate the components of the display panel DP corresponding to the opening region HA, and the components of the encapsulation layer TFE1 and the transistor layer TFL in FIG. 5 are omitted.

Referring to FIGS. 5, 6, and 7A, the opening O-2 is defined in the organic layer OL, and a portion of the auxiliary electrode SE may be exposed by the opening O-2. A portion of the exposed auxiliary electrode SE is defined as the opening region HA, and the second electrode CE may be electrically connected to the auxiliary electrode SE through the opening region HA.

In order for the light generated from the emission layer included in the organic layer OL to pass through the second electrode CE and emit light toward the display surface IS (see FIG. 1A), the second electrode CE may be provided as an electrode having relatively high light transmittance. For example, the second electrode CE may be provided as a transparent electrode or a thin electrode. In this case, the resistance of the second electrode CE may increase, and thus the IR drop phenomenon may occur. However, the second electrode CE may be in contact with the auxiliary electrode SE, and thus the resistance of the second electrode CE may be reduced and the IR drop phenomenon may be prevented.

The organic layer OL may overlap a portion of the auxiliary electrode SE, and may include a first portion O1 having a flat top surface and a second portion O2 protruding from the first portion O1 toward the encapsulation layer TFE1. Hereinafter, the second portion O2 may be referred to as a protrusion O2. A portion defined by the edge of the protrusion O2 spaced apart from the center of the opening O-2 may be referred to as a contact pattern O-1.

The protrusion O2 may be arranged adjacent to the opening O-2 formed in the organic layer OL. The protrusion O2 may be formed to surround the vicinity of the opening O-2 on a plane. A region from the end of the opening O-2 to the edge of the protrusion O2 may be defined as a protruding region MA on a plane. The protruding region MA may be adjacent to the opening region HA and may have a shape surrounding the opening region HA on a plane.

The opening region HA in which the opening O-2 is defined may have a circular shape on a plane, and the protrusion O2 may surround the circular opening O-2. That is, the protrusion O2 surrounding the opening O-2 may have a circular ring shape on a plane. However, the shape of the protrusion O2 on a plane is not limited to the illustrated embodiments, and may have various shapes corresponding to the shape of the opening O-2. For example, when the opening O-2 has a rectangular shape, the protrusion O2 may have a rectangular shape surrounding the rectangular opening O-2.

The opening O-2 and the protrusion O2 surrounding the opening O-2 may have a preset diameter on a plane. The opening region HA in which the opening O-2 is defined and the protruding region MA in which the protrusion O2 is located may be a circular region having a preset diameter on a plane. A diameter of the opening O-2 may be defined as the width of the opening O-2 in the first direction DR1.

For example, the opening O-2 may have a first diameter DI1. The edge of the protrusion O2 may have a second diameter DI2. That is, an interval between the edges of the protrusion O2 passing through the center of the opening O-2 may correspond to the second diameter DI2. According to some embodiments, the diameter of the contact pattern O-1 may correspond to the second diameter DI2.

The second diameter DI2 is greater than the first diameter DI1. According to some embodiments, the first diameter DI1 may be about 0.6 times to about 0.8 times over the second diameter DI2. However, the numerical relationship between the first diameter DI1 and the second diameter DI2 is not necessarily limited to the above example. Shapes and areas of the opening region and the protrusion O2 in the second stack ST2 on a plane may vary according to conditions such as intensity and phase of a laser forming the opening region.

According to some embodiments, the second diameter DI2 may have a value no less than a preset value. The second diameter DI2 is about 7 micrometers (μm) or more. When the second diameter DI2 is less than about 7 μm, the opening O-2 having a sufficient size is not secured, and thus the area, in which the second electrode CE is in contact with the auxiliary electrode SE, is reduced, and accordingly, even when the second electrode CE is in contact with the auxiliary electrode SE, the effect of preventing the IR drop phenomenon may not be achieved. The second diameter DI2 may be about 60 μm or less. When the second diameter DI2 is greater than about 60 μm, the area in which the auxiliary electrode SE is exposed may increase to reduce the aperture ratio of the display panel DP and thus reduce the display efficiency of the display panel DP.

Referring to FIGS. 4A, 6, and 7A, the auxiliary electrode SE may have a rectangular shape or circular shape on a plane, and may have a preset width along the first direction DR1. The auxiliary electrode SE may correspond to the opening O-2 or may have a width greater than that of the opening O-2. According to some embodiments, the auxiliary electrode SE may have a width of about 7 μm to about 60 μm along the first direction DR1. When the width of the auxiliary electrode SE is less than about 7 μm, non-uniform brightness of pixels may occur, and when the width of the auxiliary electrode SE is greater than about 60 μm, the aperture ratio of the display panel DP may decrease to thus reduce the display efficiency of the display panel DP.

The opening region HA of the organic layer OL of the inventive concept may be formed by a laser having an improvement in energy intensity uniformity. The opening region HA formed by the laser having an improvement in energy intensity uniformity may have a circular shape having a substantially uniform size in diameter on a plane. In addition, the components, needed to be removed, corresponding to the opening region HA among the components of the organic layer OL may be removed as much as need be, and the second electrode CE deposited on the opening region HA may be deposited without a damaged portion.

The protrusion O2 may include a curved surface on a cross-section. According to some embodiments, the curved surface of the protrusion O2 may be formed to overlap the protrusion region MA. Due to the protrusion O2, the thickness of a portion of the organic layer OL overlapping the auxiliary electrode SE may be greater than the thickness of the organic layer OL overlapping the first electrode AE.

Referring to FIG. 7A, the organic layer OL may include, on the auxiliary electrode SE, a first portion O1 having a flat top surface and a protrusion O2 protruding from the first portion O1 toward the third direction DR3. The organic layer OL may have a first thickness Th1 within a region that does not overlap the opening region HA and the protruding region MA. A portion of the organic layer OL in which the protrusion O2 is formed may have a second thickness Th2 within the protruding region MA.

The first thickness Th1 may correspond to a thickness of the first portion O1 except for the protrusion O2 within the area non-overlapping the opening region HA and the protruding region MA. The first thickness Th1 may correspond to a distance spaced apart, along the third direction DR3, from the top surface of the auxiliary electrode SE to the top surface that does not overlap the protrusion O2 of the organic layer OL.

The second thickness Th2 may be the sum of the thicknesses of the first thickness Th1 and the protrusion O2. The second thickness Th2 may correspond to a distance spaced apart, along the third direction DR3, from the top surface of the auxiliary electrode SE to the apex of the top surface of the protrusion O2.

The second thickness Th2 may be greater than the first thickness Th1. For example, the second thickness Th2 may be about 1.3 times to about 1.5 times over the first thickness Th1. However, the relationship between the first thickness Th1 and the second thickness Th2 is not necessarily limited to the above example. The thickness of the organic layer OL adjacent to the opening O-2 may vary according to conditions such as intensity and phase of a laser forming a through hole TH.

The opening O-2 may be formed through a laser drilling process, which will be described later. In the process of forming the opening O-2, a portion of the organic layer OL may be pushed out in an outward direction of the opening O-2 by a laser. In this process, the protrusion O2 may be formed in the organic layer OL.

Referring to FIG. 3A and FIG. 7A together, in the display panel DP, the openings O-2 may be included in a total of about 200 thousand to about one million. The display panel DP according to some embodiments has the auxiliary electrodes SE and openings O-2 corresponding to the number of pixels PX. According to some embodiments, the display panel DP has about 200 thousand to about one million openings O-2. According to some embodiments, the display panel DP may have about seven million to about 35 million pixels PX and about 200 thousand to about one million openings O-2. When the number of the openings O-2 provided in the display panel DP is less than about 200 thousand, the area in which the second electrode CE is in contact with the auxiliary electrode SE may be reduced to cause non-uniform brightness, and when the number of the openings O-2 provided in the display panel DP is greater than about one million, the aperture ratio of the display panel DP may decrease to thus reduce the display efficiency of the display panel DP.

Referring to FIG. 4A and FIG. 7A together, the width of the auxiliary electrode SE in the first direction DR1 may have a value of about 4% to about 20% of a first distance P1 with respect to the first distance P1 that is a distance between two adjacent pixels $PX_{11}$ and $PX_{12}$ along the first direction DR1. When the width of the auxiliary electrode SE in the first direction DR1 is less than about 4% of the first distance P1, the area in which the second electrode CE is in contact with the auxiliary electrode SE may be reduced to cause non-uniform brightness, and when the width of the auxiliary electrode SE in the first direction DR1 is greater than about 20% of the first distance P1, the aperture ratio of the display panel DP may decrease to thus reduce the display efficiency of the display panel DP.

Meanwhile, referring to FIG. 7A, the light emitting element OLED may further include a capping layer CPL located on the second electrode CE. The capping layer CPL may have a single-layer structure or a multi-layer structure. The capping layer CPL may include an organic layer or inorganic layer. For example, the inorganic layer of the capping layer CPL may include at least one of an alkaline metal compound such as LiF, an alkaline earth metal compound such as $MgF_2$, a silicon nitride, a silicon oxynitride, or a silicon oxide. The organic layer of the capping layer CPL may include α-NPD, NPB, TPD, m-MTDATA, $Alq_3$, CuPc, TCTA, an epoxy resin, or an acrylate-based resin. However, the material of the capping layer CPL is not limited to the above examples.

Referring to FIGS. 6, 7A, and 7B together, in the display panel DP according to some embodiments, the organic layer DO may further include an intermediate portion O3. The intermediate portion O3 may be adjacent to the opening O-2, and may be located between the opening O-2 and the portion in which the protrusion O2 is located. The region in which the protrusion O2 is located may be referred to as a protruding region MA1, and the region in which the intermediate portion O3 is located may be referred to as an intermediate region MA2.

The intermediate portion O3 may be have a circular shape surrounding the opening O-2 on a plane. The intermediate portion O3 may be adjacent to the opening O-2, and may have a slope of the organic layer OL smaller than that of the portion in which the protrusion O2 is located. The organic layer OL is not located in the opening O-2, the organic layer OL is located at a relatively gentle slope in the intermediate portion O3, and the organic layer OL is located at a steep slope in the portion in which the protrusion O2 is located. The intermediate portion O3 may be a remaining portion of the organic layer OL, which is not entirely removed, because a laser at the edge is weaker than a laser at the center in a laser process, which will be described later. The intermediate portion O3 may be thinner than other portions in which the organic layer OL is located.

Figure 8A:
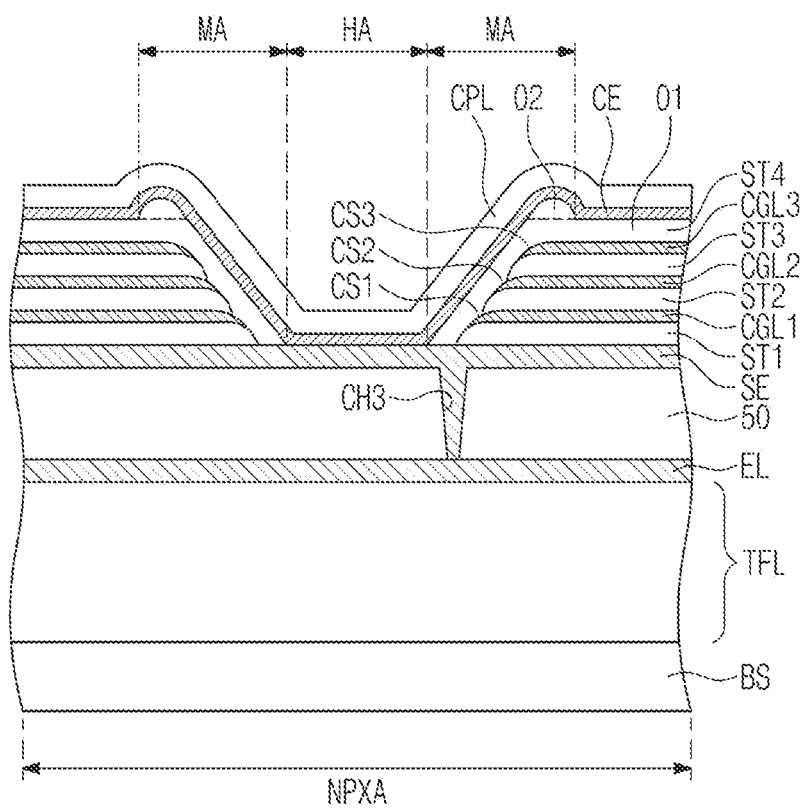
FIG. 8A is a cross-sectional view of a display panel corresponding to hole region according to some embodiments of the inventive concept.
Figure 8A:
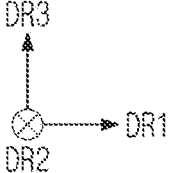
Figure 8B:
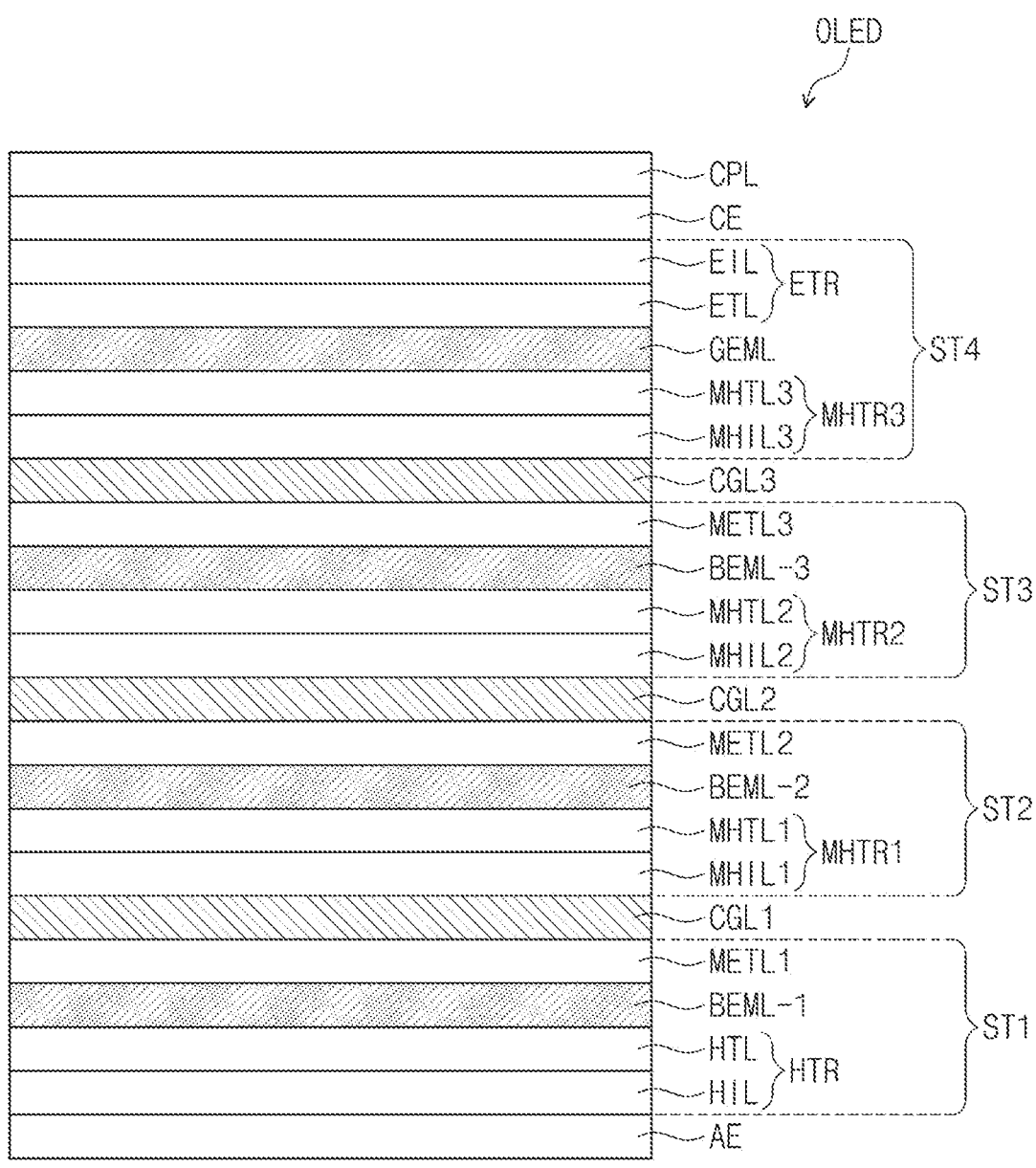
FIG. 8B is a cross-sectional view schematically illustrating a stacked structure of a light emitting element according to some embodiments of the inventive concept.

FIG. 8A is a cross-sectional view of a display panel corresponding to hole region according to some embodiments of the inventive concept. FIG. 8B is a cross-sectional view schematically illustrating a stacked structure of a light emitting element according to some embodiments of the inventive concept.

According to some embodiments, the organic layer OL is illustrated as a single layer for convenience of description, and in the embodiments illustrated in FIG. 4B, it is illustrated that the light emitting element OLED includes the single emission layer EML. However, the embodiments of the inventive concept are not limited thereto, and the light emitting element OLED may include a plurality of stacks, and each of the plurality of stacks may include an emission layer. In addition, the light emitting element OLED according to some embodiments may include a plurality of charge generation layers located between the plurality of stacks. Referring to FIG. 8A, an organic layer OL may include first to fourth stacks ST1, ST2, ST3, and ST4, and first to third charge generation layers CGL1, CGL2, and CGL3 located between the plurality of stacks. The embodiments illustrated in FIG. 8A includes substantially identical components to the embodiments illustrated in FIG. 7A, and there are some differences in the components of the organic layer OL. Hereinafter, differences will be described with respect to the embodiments in FIGS. 8A and 8B.

Referring to FIGS. 8A and 8B, each of the first to fourth stacks ST1, ST2, ST3, and ST4 may include functional layers containing a hole transport material and an electron transport material, and an emission layer containing a light emitting material.

The first charge generation layer CGL1 may be located between the first stack ST1 and the second stack ST2. The second charge generation layer CGL2 may be located between the second stack ST2 and the third stack ST3. The third charge generation layer CGL3 may be located between the third stack ST3 and the fourth stack ST4.

Each of the first to third charge generation layers CGL1, CGL2, and CGL3 may generate charges (electrons and holes) by forming a complex through an oxidation-reduction reaction when a voltage is applied thereto. Thereafter, the first to third charge generation layers CGL1, CGL2, and CGL3 may provide the generated charges for the adjacent stacks ST1, ST2, ST3, and ST4, respectively. The first to third charge generation layers CGL1, CGL2, and CGL3 may double the efficiency of currents generated in the adjacent stacks ST1, ST2, ST3, and ST4, and may serve to adjust the balance of charges between the adjacent stacks ST1, ST2, ST3, and ST4.

Each of the first to third charge generation layers CGL1, CGL2 and CGL3 may include an n-type layer and p-type layer. The first to third charge generation layers CGL1, CGL2 and CGL3 may have a structure in which the n-type layer and the p-type layer are junctioned to each other. However, the embodiments of the inventive concept are not limited thereto, and the first to third charge generation layers CGL1, CGL2 and CGL3 may include only any one among the n-type layer and the p-type layer. The n-type layer may be a charge generation layer that provides electrons for an adjacent stack. The n-type layer may be a layer in which an n-dopant is doped in a base material. The p-type layer may be a charge generation layer that provides holes for an adjacent stack.

According to some embodiments, the thickness of each of the first to third charge generation layers CGL1, CGL2, and CGL3 may be about 1 Å to about 150 Å. The concentration of the n-dopant doped in the first to third charge generation layers CGL1, CGL2, and CGL3 may be about 0.1% to about 3%, for example, about 1% or less. When the concentration is less than about 0.1%, the effects of the first to third charge generation layers CGL1, CGL2, and CGL3, which adjust the balance of charges, may hardly occur. When the concentration is greater than about 3%, the light efficiency of the light emitting element OLED may be reduced.

Each of the first to third charge generation layers CGL1, CGL2, and CGL3 may include a charge generation compound that is formed of an aryl amine-based organic compound, a metal, an oxide, a carbide, and a fluoride of the metal, or a mixture thereof. For example, the aryl amine-based organic compound may include α-NPD, 2-TNATA, TDATA, MTDATA, sprio-TAD, or sprio-NPB. The metal may include cesium (Cs), molybdenum (Mo), vanadium (V), titanium (Ti), tungsten (W), barium (Ba), or lithium (Li). The oxide, carbide, and fluoride of the metal may include $Re_2O_7$, $MoO_3$, $V_2O_5$, $WO_3$, $TiO_2$, $Cs_2CO_3$, BaF, LiF, or CsF. However, materials of the first to third charge generation layers CGL1, CGL2 and CGL3 are not limited to the above examples.

Each of the first to third charge generation layers CGL1, CGL2 and CG3 may be spaced apart from the second electrode CE. Each of the first to third charge generation layers CGL1, CGL2 and CG3 may include an opening region, and each of ends of the first to third charge generation layers CGL1, CGL2 and CG3 corresponding to the boundary of the opening region may be bent to include curved surfaces CS1, CS2 and CS3. Thus, the first to third charge generation layers CGL1, CGL2 and CG3 may be spaced apart from the second electrode CE and may be electrically insulated.

The curved surfaces CS1, CS2, and CS3 of the first to third charge generation layers CGL1, CGL2, and CG3 may overlap the top surface of a fourth organic layer ST4 located in the protruding region MA. The curved surfaces CS1, CS2, and CS3 of the first to third charge generation layers CGL1, CGL2, and CG3 may be covered by the fourth organic layer ST4. Each of the ends of the first to third charge generation layers CGL1, CGL2, and CG3 may be spaced apart from the second electrode CE with the fourth organic layer ST4, which is located at the uppermost portion of the organic layer OL, located therebetween.

The fourth organic layer ST4 located at the uppermost portion of the organic layer OL may include a first portion O1 including a flat top surface and a protrusion O2 protruding from the first portion O1. The protrusion O2 of the fourth organic layer ST4 may be formed between the third charge generation layer CGL3 located below the fourth organic layer ST4 and the second electrode CE to separate the third charge generation layer CGL3 from the second electrode CE. Thus, a leakage current due to the contact between the second electrode CE and the first to third charge generation layers CGL1, CGL2 and CG3 may be prevented, and the display panel DP may emit light with uniform brightness.

Meanwhile, the above descriptions may be equally applied to the total thickness of the organic layer OL, the sizes of the opening region HA and the protruding region MA, and the like in the embodiments illustrated with respect to FIG. 8A.

Referring to FIG. 8B, the light emitting element OLED according to some embodiments may include a first electrode AE, a second electrode CE facing the first electrode AE, and first to fourth stacks ST1, ST2, ST3, and ST4 located between the first electrode AE and the second electrode CE. Meanwhile, FIG. 8B illustrates that the light emitting element OLED includes four stacks, but the number of stacks included in the light emitting element OLED may be less or greater than this.

The light emitting element OLED may include first to third charge generation layers CGL1, CGL2, and CGL3 located between the first to fourth stacks ST1, ST2, ST3, and ST4. The above description may be equally applied to the first to third charge generation layers CGL1, CGL2 and CGL3.

Each of the first to fourth stacks ST1, ST2, ST3, and ST4 may include an emission layer. The first stack ST1 may include a first emission layer BEML-1, the second stack ST2 may include a second emission layer BEML-2, the third stack ST3 may include a third emission layer BEML-3, and the fourth stack ST4 may include a fourth emission layer GEML. Some of the emission layers included in the first to fourth stacks ST1, ST2, ST3, and ST4 may emit substantially identical color light, and some may emit different color light. However, the embodiments of the inventive concept are not limited thereto, and all of the emission layers included in the first to fourth stacks ST1, ST2, ST3, and ST4 may emit substantially identical color light.

According to some embodiments, the first to third emission layers BEML-1, BEML-2, and BEML-3 of the first to third stacks ST1, ST2, and ST3 may emit substantially identical first color light. For example, the first color light may be blue light. A wavelength range of light emitted by the first to third emission layers BEML-1, BEML-2, and BEML-3 may be about 420 nm to about 480 nm.

The fourth emission layer GEML of the fourth stack ST4 may emit second color light different from the first color light. For example, the second color light may be green light. A wavelength range of light emitted by the fourth emission layer GEML may be about 520 nm to about 600 nm.

At least some among the first to fourth light emitting layers BEML-1, BEML-2, BEML-3, and GEML may have a bi-layer structure including different host materials. For example, one layer of the bi-layer structure may include a hole transport host material, and the other may include an electron transport host material. The electron transport host material may be a material including an electron transport moiety in the molecular structure.

The first stack ST1 may include a hole transport region HTR for transporting holes provided from the first electrode AE to the first emission layer BEML-1, and a first intermediate electron transport region METL1 for transporting electrons generated from the first charge generation layer CGL1 to the first emission layer BEML-1.

The hole transport region HTR may include a hole injection layer HIL located on the first electrode AE and a hole transport layer located on the hole injection layer. However, the embodiments of the inventive concept are not limited thereto, and the hole transport region HTR may further include at least one of a hole buffer layer, an emission auxiliary layer, or an electron blocking layer. The hole buffer layer may compensate for a resonance distance according to the wavelength of light emitted from the emission layer to thus increase luminous efficiency. The electron blocking layer may serve to prevent electron injection from the electron transport region into the hole transport region.

The first intermediate electron transport region METL1 may include a first intermediate electron transport layer located on the first emission layer BEML-1. However, the embodiments of the inventive concept are not limited thereto, and the first intermediate electron transport region METL1 may further include at least one of an electron buffer layer or a hole blocking layer.

The second stack ST2 may include a first intermediate hole transport region MHTR1 for transporting holes generated from the first charge generation layer CGL1 to the second emission layer BEML-2, and a second intermediate electron transport region METL2 for transporting electrons provided from the second charge generation layer CGL2 to the second emission layer BEML-2.

The first intermediate hole transport region MHTR1 may include a first intermediate hole injection layer MHIL1 located on the first charge generation layer CGL1 and a first intermediate hole transport layer MHTL1 located on the first intermediate hole injection layer MHIL1. The first intermediate hole transport region MHTR1 may further include at least one of a hole buffer layer, an emission auxiliary layer, or an electron blocking layer located on the first intermediate hole transport layer MHTL1.

The second intermediate electron transport region METL2 may include a second intermediate electron transport layer located on the second emission layer BEML-2.

However, the embodiments of the inventive concept are not limited thereto, and the second intermediate electron transport region METL2 may further include at least one of an electron buffer layer or a hole blocking layer located between the second intermediate electron transport layer and the second emission layer BEML-2.

The third stack ST3 may include a second intermediate hole transport region MHTR2 for transporting holes generated from the second charge generation layer CGL2 to the third emission layer BEML-3, and a third intermediate electron transport region METL3 for transporting electrons provided from the third charge generation layer CGL3 to the third emission layer BEML-3.

The second intermediate hole transport region MHTR2 may include a second intermediate hole injection layer MHIL2 located on the second charge generation layer CGL2 and a second intermediate hole transport layer MHTL2 located on the second intermediate hole injection layer MHIL2. However, the embodiments of the inventive concept are not limited thereto, and the second intermediate hole transport region MHTR2 may further include at least one of a hole buffer layer, an emission auxiliary layer, or an electron blocking layer located on the second intermediate hole transport layer MHTL2.

The third intermediate electron transport region METL3 may include a third intermediate electron transport layer located on the third emission layer BEML-3. However, the embodiments of the inventive concept are not limited thereto, and the third intermediate electron transport region METL3 may further include at least one of an electron buffer layer or a hole blocking layer located between the third intermediate electron transport layer and the third emission layer BEML-3.

The fourth stack ST4 may include a third intermediate hole transport region MHTR3 for transporting holes generated from the third charge generation layer CGL3 to the fourth emission layer GEML, and an electron transport region ETR for transporting electrons provided from the second electrode CE to the fourth emission layer GEML.

The third intermediate hole transport region MHTR3 may include a third intermediate hole injection layer MHIL3 located on the third charge generation layer CGL3 and a third intermediate hole transport layer MHTL3 located on the third intermediate hole injection layer MHIL3. However, the embodiments of the inventive concept are not limited thereto, and the third intermediate hole transport region MHTR3 may further include at least one of a hole buffer layer, an emission auxiliary layer, or an electron blocking layer located on the third intermediate hole transport layer MHTL3.

The electron transport region ETR may include an electron transport layer ETL located on the fourth emission layer GEML, and an electron injection layer EIL located on the electron transport layer ETL. However, the embodiments of the inventive concept are not limited thereto, and the electron transport region ETR may further include at least one of an electron buffer layer or a hole blocking layer located between the electron transport layer ETL and the fourth emission layer GEML.

According to some embodiments, the light emitting element OLED may emit light from the first electrode AE to the second electrode CE, and with respect to the direction in which the light is emitted, the hole transport region HTR may be located below the plurality of stacks ST1, ST2, ST3, and ST4, and the electron transport region ETR may be located above the plurality of stacks ST1, ST2, ST3, and ST4. However, the embodiments of the inventive concept are not limited thereto, and the light emitting element OLED may have an inverted element structure in which the electron transport region ETR may be located below the plurality of stacks ST1, ST2, ST3, and ST4 and the hole transport region HTR may be located above the plurality of stacks ST1, ST2, ST3, ST4 with respect to the direction in which the light is emitted.

Figure 9:
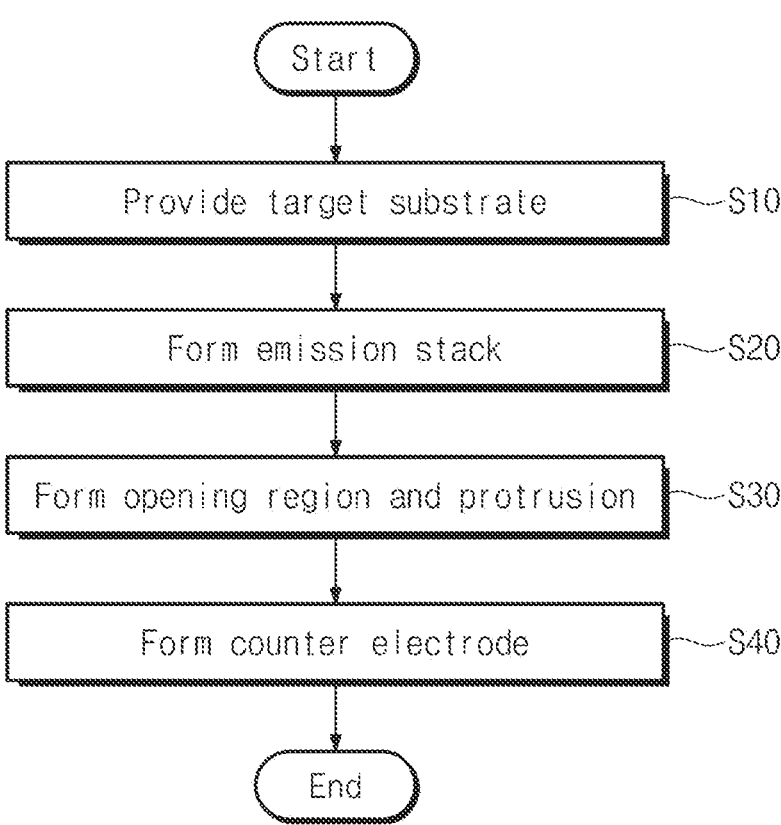
FIG. 9 is a flowchart illustrating a method of manufacturing a display panel according to some embodiments of the inventive concept.

FIG. 9 is a flowchart illustrating a method of manufacturing a display panel according to some embodiments of the inventive concept. FIGS. 10A to 10D are cross-sectional views corresponding to one operation of a method of manufacturing a display panel according to some embodiments of the inventive concept. Each of FIGS. 10A to 10D may correspond to the cross-sectional view illustrated in FIG. 5, and illustrates a manufacturing operation of the display panel DP including the embodiments illustrated in FIG. 7B.

Referring to FIG. 9, the method of manufacturing a display panel according to some embodiments may include providing a target substrate (S10), forming an emission stack (S20), forming an opening region and a protrusion (S30), and forming a counter electrode (S40).

The providing of the target substrate (S10) may include providing the target substrate in which a pixel electrode and an auxiliary electrode are formed. The forming of the emission stack (S20) may include forming by depositing the emission stack, which include the above-described plurality of organic layers and the charge generation layer, on the pixel electrode and the auxiliary electrode.

The forming of the opening region and protrusion (S30) may form, by a laser drilling, an opening passing through the components of the emission stack arranged to overlap the auxiliary electrode, and the region in which the opening is formed may be defined as the opening region. In the forming of the opening region, an area in which a laser is emitted may be designed to have a width no less than a preset width so that an area, in which the second electrode is in contact with the auxiliary electrode, is sufficiently secured in a subsequent stage. Further, a protrusion protruding upwardly may be formed in a portion of the organic layer of the emission stack exposed to the laser, by a force that pushes out the portion toward the outside of the opening region.

The forming of the counter electrode (S40) may include depositing the counter electrode on a through hole and the emission stack overlapping the pixel electrode. Thus, the counter electrode may be formed which faces the pixel electrode and is electrically connected to the auxiliary electrode through the through hole.

Figure 10A:
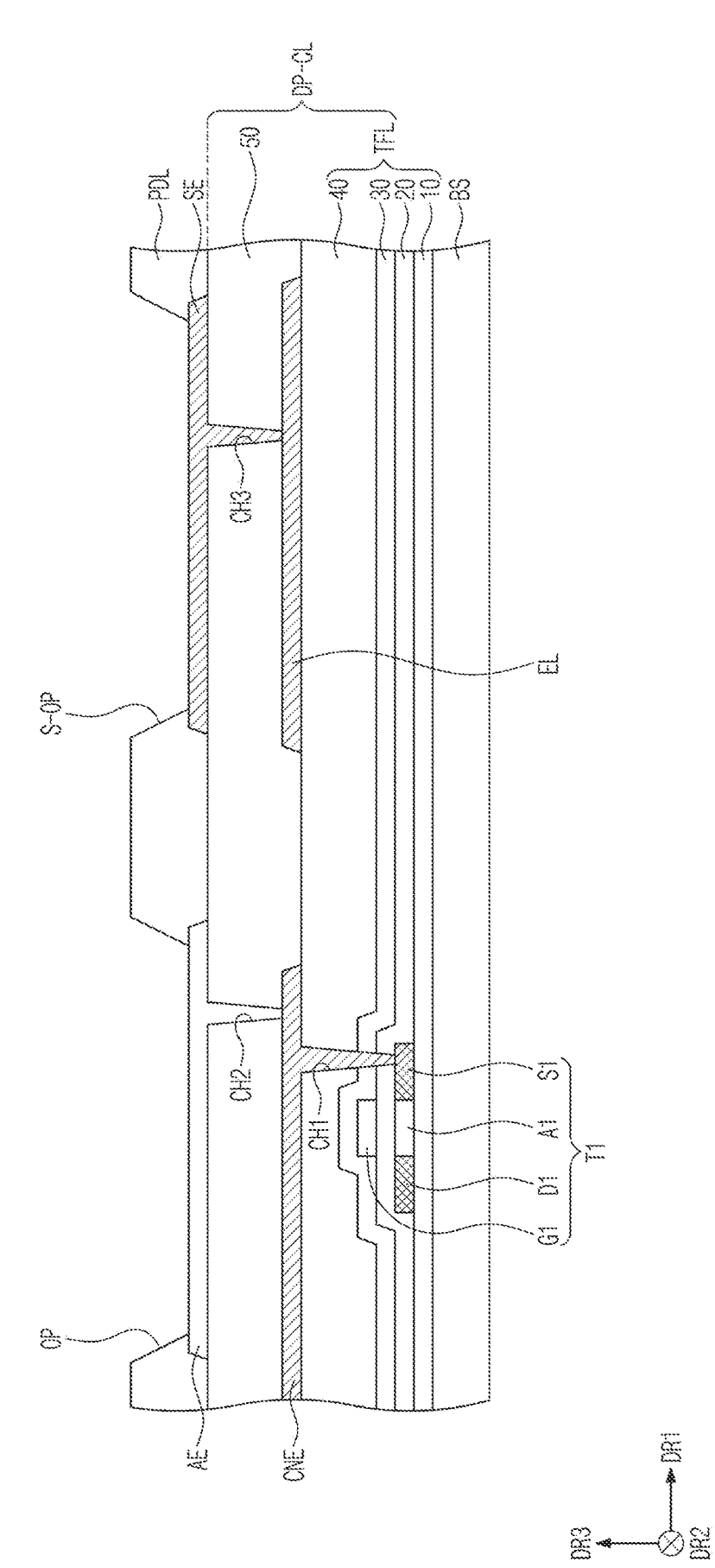
FIGS. 10A to 10D are cross-sectional views corresponding to one operation of a method of manufacturing a display panel according to some embodiments of the inventive concept.

FIG. 10A illustrates a cross section of a target substrate P-SUB provided in the providing of the target substrate (S10). Referring to FIG. 10A, the target substrate P-SUB provided in the providing of the target substrate (S10) may include a pixel electrode AE and an auxiliary electrode SE spaced apart from the pixel electrode AE. The target substrate P-SUB may correspond to a substrate of an operation before an organic layer OL is formed on the pixel electrode AE and the auxiliary electrode SE.

The auxiliary electrode SE may be located on the same layer as the pixel electrode AE and may be formed by the same process as the pixel electrode AE. A fourth insulating layer 50 may be formed which is deposited by using a method such as spin coating or chemical vapor deposition, and then contact holes CH2 and CH3 may be formed which penetrate the fourth insulating layer 50. A metal layer may be deposited and patterned on the fourth insulating layer 50 to form the pixel electrode AE and the auxiliary electrode SE. The pixel electrode AE and the auxiliary electrode SE may include the same material. Thus, the number of overall processes may not be increased to form the auxiliary electrode SE.

A pixel defining film PDL may be formed between the pixel electrode AE and the auxiliary electrode SE. The pixel defining film PDL may be formed on the pixel electrode AE and the auxiliary electrode SE by a coating or deposition method, and then, an emission opening OP for exposing a portion of the pixel electrode AE and an opening S-OP for exposing a portion of the auxiliary electrode SE may be formed through a mask process. The pixel defining film PDL may have a preset thickness to allow a preset interval between the counter electrode CE and the edge of the pixel electrode AE. Accordingly, an electric field is prevented from being focused on the edge of the pixel electrode AE, and thus a short circuit between the pixel electrode AE and the counter electrode CE may be prevented.

Figure 10B:
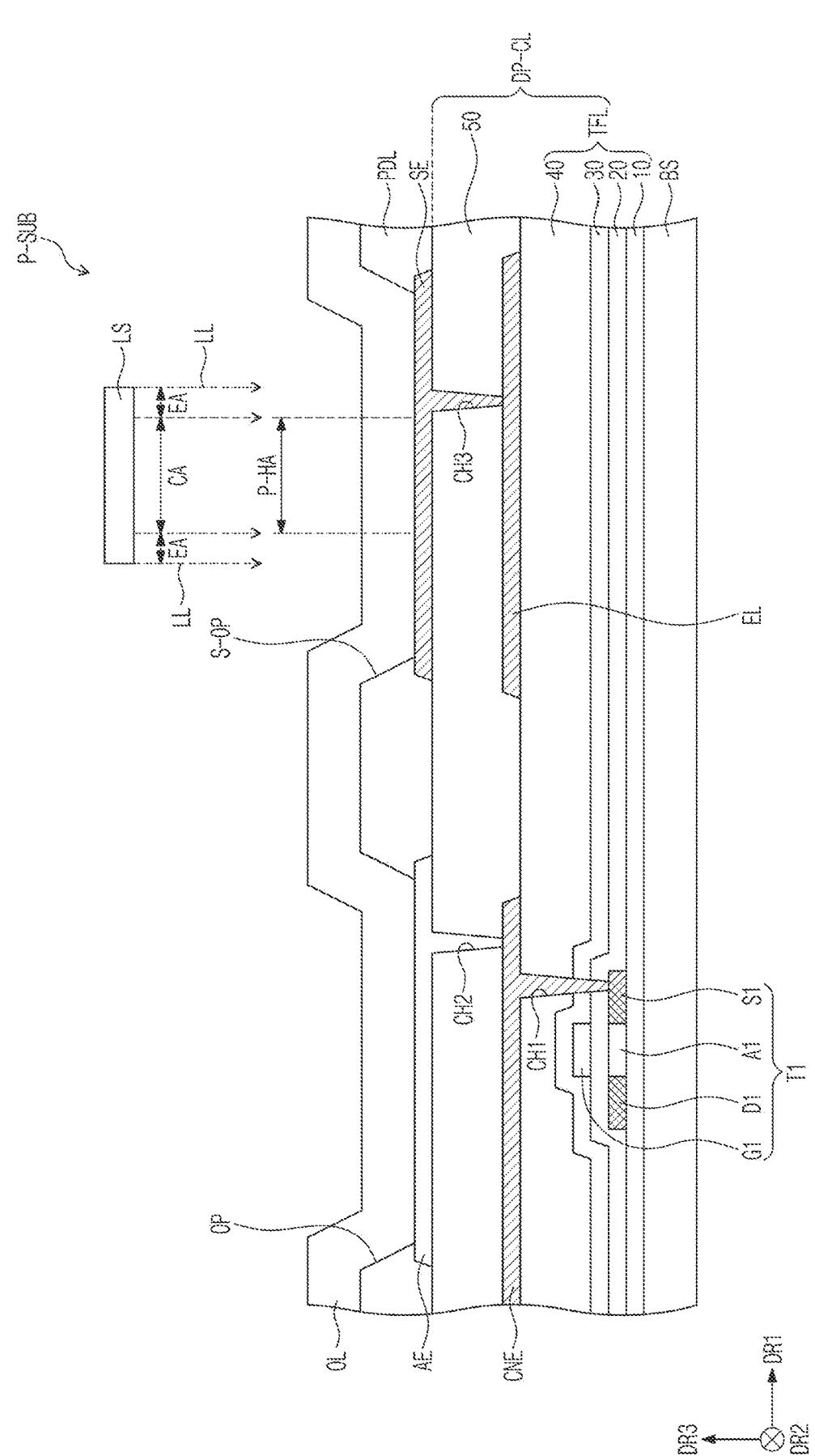

FIG. 10B may correspond to a cross-section of the target substrate P-SUB after the forming of the emission stack (S20), and may correspond to the forming of the opening region and protrusion (S30). Referring to FIG. 10B, the organic layer OL may be formed on the target substrate P-SUB in FIG. 10A. The above description may be equally applied to the organic layer OL and a formation process of the organic layer OL will be mainly described.

An emission layer and functional layer included in the organic layer OL may be commonly formed in the light emitting region PXA and the non-light emitting region NPXA. The emission layer and functional layer included in the organic layer OL may be formed as a common layer using an open mask. However, the embodiments of the inventive concept are not limited thereto, and the emission layer among the layers included in the organic layer OL may be formed in an emission pattern form to be arranged corresponding to the pixel electrode AE.

A portion of the organic layer OL commonly formed in the light emitting region PXA and the non-light emitting region NPXA may be formed on the auxiliary electrode SE. A preliminary hole region P-HA in which the opening passing through the organic layer OL is to be formed may be defined in the organic layer OL overlapping the auxiliary electrode SE.

The light irradiation part LS may be provided on the organic layer OL to correspond to the preliminary hole region P-HA. The light irradiation part LS may emit a laser LL toward the preliminary hole region P-HA of the organic layer OL.

The laser LL may be provided as a Gaussian beam having excellent uniformity of intensity. When the through hole is formed by using the laser with reduced uniformity, there may occur a phenomenon in which a portion of the emission stack corresponding to the preliminary hole region P-HA is insufficiently removed or a crack occurs. However, when the hole is formed by using the laser LL with excellent uniformity, process reliability and accuracy may be improved. Therefore, the reliability of the display panel DP manufactured by the method of manufacturing a display panel according to the inventive concept may be improved.

The wavelength of the laser LL may be included in a wavelength range of ultraviolet rays. For example, the wavelength of the laser LL may be about 300 nm to about 400 nm. However, the wavelength of the laser LL is not limited to the numerical example.

An output per unit area of the laser LL may be about 200 mJ/cm$^2$ or less. For example, the output per unit area of the laser LL may be about 50 mJ/cm$^2$ to about 200 mJ/cm$^2$. When the output per unit area of the laser LL is less than about 50 mJ/cm$^2$, the components of the organic layer OL corresponding to the preliminary hole region P-HA may be insufficiently removed. When the output per unit area of the laser LL is greater than about 200 mJ/cm$^2$, the organic layer OL is removed, and moreover, the auxiliary electrode SE formed below the organic layer OL may be damaged.

The laser LL may have a circular phase on a plane. The phase of the laser LL may include a central region CA and an edge region EA surrounding the central region CA. The intensity of the laser LL corresponding to the central region CA may be greater than the intensity of the laser LL corresponding to the edge region EA.

The intensity of the laser LL corresponding to the central region CA may be sufficient to remove the organic layer OL. The light irradiation part LS may emit the laser LL onto the preliminary hole region P-HA after the position of the central region CA of the laser LL to be emitted is adjusted so as to correspond to the preliminary hole region P-HA.

A diameter of a circle corresponding to the central region CA of the laser LL may be defined as a size of the laser LL. According to some embodiments, the size of the laser LL may be about 5 μm to about 10 μm. However, the size of the laser LL is not limited to the numerical example.

The intensity of the laser LL corresponding to the edge region EA may be less than a threshold value required to remove the organic layer OL. A portion of the organic layer OL exposed to the laser LL overlapping the edge region EA may not be removed and may remain.

A diameter of the edge region EA of the laser LL may be greater than that of the central region CA. For example, the diameter of the edge region EA of the laser LL may be about 20% to about 40% greater than that of the central region CA. The diameter of the edge region EA of the laser LL may be about 6 μm to about 14 μm. However, the size of the edge region EA of the laser LL is not limited to the numerical example.

Figure 10C:
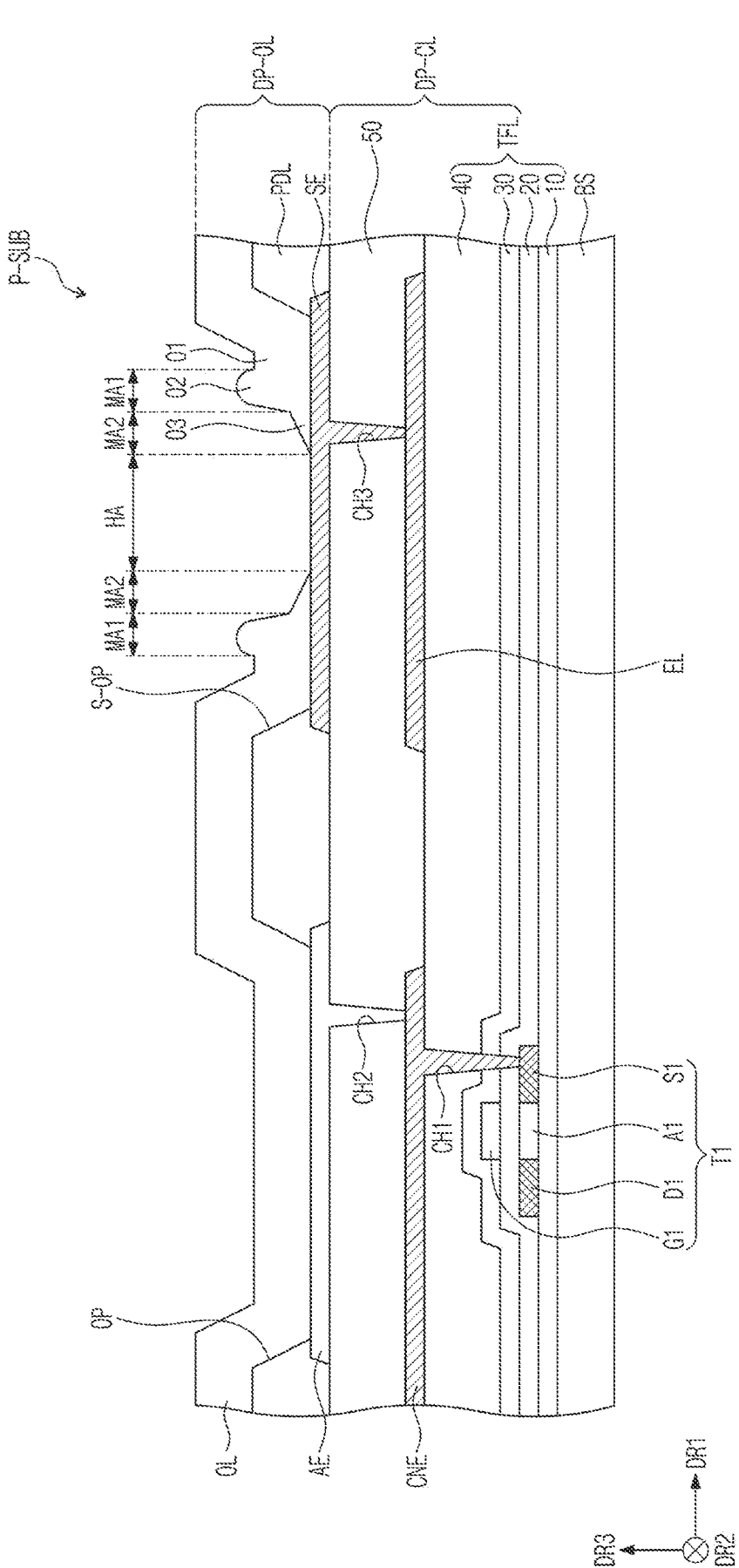

FIG. 10C may correspond to a cross section of the target substrate P-SUB in one operation in which an opening region corresponding to an opening region HA and the protrusion O2 are formed in the organic layer OL. The above description may be equally applied to the configuration of the opening region and the protrusion O2.

Referring to FIG. 10C, the opening region HA, which penetrates the organic layer OL and exposes a portion of the auxiliary electrode SE, may be formed in the organic layer OL corresponding to the central region CA of the laser LL. The opening region HA may correspond to one region of the auxiliary electrode SE exposed to an opening O-2 (see FIG. 7A) of the organic layer OL formed to overlap the auxiliary electrode SE. The opening region HA may have a circular shape on a plane like the phase of the laser LL. A diameter of the opening region HA may be substantially equal to or less than the size of the laser LL. Therefore, the size of the laser LL may be adjusted, and thus the size of the opening region HA may be adjusted variously.

An intermediate portion O3 may be formed in the organic layer OL corresponding to the edge region EA of the laser LL. The intermediate portion O3 may be formed in an intermediate region MA2 adjacent to the opening region HA, and may be a portion in which the organic layer OL is not entirely removed and a portion of the organic layer OL remains because the laser of the edge region EA is weaker than the laser of the central region CA. The intermediate portion O3 may be thinner than other portions in which the organic layer OL is located. The protrusion O2 may be formed in an outer region of the intermediate portion O3. The intermediate portion O3 and the protrusion O2 may have a ring shape surrounding the opening region HA on a plane. In a process of emitting the laser LL, organic materials of the organic layer OL are not removed and pushed out to the outer region, and thus the protrusion O2 may be formed. The protrusion O2 may be a portion having the organic layer OL thicker than other portions, and the slope of the portion in which the protrusion O2 is located may be steeper than that of the intermediate portion O3. A region from the edge of the intermediate portion O3 to the edge of the protrusion O2 may be referred to as a protruding region MA1.

Figure 10D:
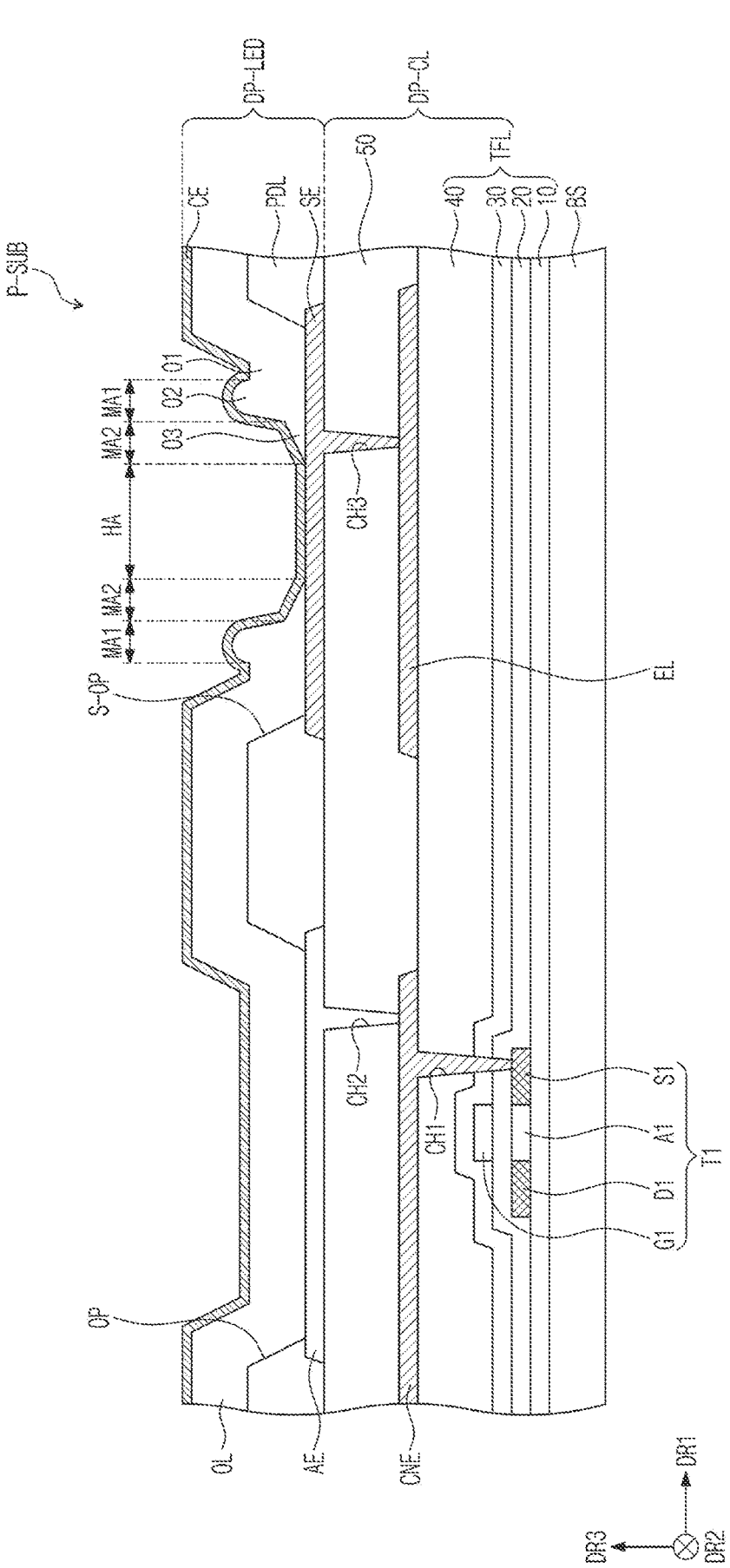

FIG. 10D illustrates a cross-section of the display panel DP in which the counter electrode CE is formed, after the forming of the counter electrode (S40). The counter electrode CE may be formed on the organic layer OL to face the pixel electrode AE, and may be formed, via a deposition process, on the opening region HA formed on the auxiliary electrode to be in contact with a portion of the auxiliary electrode SE.

Meanwhile, according to the configuration of the display panel DP, the method of manufacturing the display panel according to some embodiments may further include forming a capping layer CPL (see FIG. 7A) and an encapsulation layer TFE1 (see FIG. 5) on the counter electrode CE after the counter electrode CE is formed. However, the embodiments of the inventive concept are not necessarily limited thereto.

The display panel according to some embodiments may prevent the IR drop phenomenon by bringing the second electrode into contact with the auxiliary electrode to which the second voltage is applied. Accordingly, the display panel may emit light with uniform brightness and prevent a phenomenon that brighter light is emitted in some regions due to a leakage current. Meanwhile, in the method of manufacturing the display panel according to some embodiments, when an opening for bringing the second electrode into contact with the auxiliary electrode is formed, a laser beam is emitted to form the opening in the organic layer, and a portion of the organic layer is pushed out to the outer region when emitting a laser beam, and thus the protrusion having an increased thickness is formed. In the display panel according to some embodiments, the width of the protrusion in one direction and the total number of openings for bringing the second electrode into contact with the auxiliary electrode are determined within a preset range to thus prevent the IR drop phenomenon, thereby preventing non-uniform brightness of pixels while the aperture ratio of the display panel is secured to be no less than a preset value, thereby preventing a decrease in display efficiency of the display panel.

In a display panel according to some embodiments of the inventive concept, a second electrode may be connected to a portion of the auxiliary electrode to which a second voltage is applied, and thus instances of an IR drop phenomenon may be prevented or reduced, thereby preventing or reducing instances or degree of non-uniform brightness of pixels. Also, an opening rate of the display panel may be secured above a certain (e.g., a set or predetermined) level, and thus the display efficiency of the display panel may be relatively improved.

Although aspects of some embodiments of the inventive concept have been described with reference to some embodiments of the inventive concept, it will be understood that embodiments according to the inventive concept should not be limited to these embodiments but various changes and modifications can be made by those skilled in the art without departing from the spirit and scope of embodiments according to the inventive concept. Accordingly, the technical scope of embodiments according to the inventive concept is not intended to be limited to the contents set forth in the detailed description of the specification, but is intended to be defined by the appended claims, and their equivalents.

What is claimed is:

1. A display panel comprising:
a base substrate having a base surface parallel to a plane defined by a first direction and a second direction crossing the first direction;
a circuit layer on the base substrate;
a first electrode in a first region on the circuit layer;
an auxiliary electrode in a second region on the circuit layer and spaced apart from the first electrode;
an organic layer on the first electrode and the auxiliary electrode and including a plurality of openings overlapping the auxiliary electrode, the organic layer including at least one emission layer; and
a second electrode on the organic layer,
wherein:
the second electrode is electrically connected to the auxiliary electrode via each of the plurality of openings;
at least a portion of the organic layer includes a plurality of protrusions having a shape surrounding each of the plurality of openings; and
a width of each of the plurality of protrusions in the first direction is 7 μm or more in a plan view.

2. The display panel of claim 1, wherein a width of each of the plurality of openings in the first direction is 0.6 times to 0.8 times more than the width of each of the plurality of protrusions in the first direction.

3. The display panel of claim 1, wherein a sheet resistance of the second electrode is 30Ω/□ or less.

4. The display panel of claim 1, wherein a thickness of the second electrode is 50 Å or more.

5. The display panel of claim 1, wherein the organic layer comprises 200 thousand to one million of the plurality of openings.

6. The display panel of claim 1, wherein the organic layer comprises:
a first stack on the first electrode and including a first opening overlapping the auxiliary electrode;
a charge generation layer on the first stack and including a second opening overlapping the first opening; and
a second stack on the charge generation layer and including a third opening overlapping the first opening and the second opening.

7. The display panel of claim 6, wherein:
the first stack includes a first emission layer overlapping the first electrode;
the second stack includes a second emission layer overlapping the first electrode; and
the first emission layer is configured to emit light having different color from the second emission layer.

8. The display panel of claim 1, further comprising:
a capping layer on the second electrode; and
an encapsulation layer on the capping layer, wherein the encapsulation layer includes a plurality of inorganic films and at least one organic film between the plurality of inorganic films.

9. The display panel of claim 1, wherein the auxiliary electrode has a circular shape or a rectangular shape in the plan view.

10. The display panel of claim 1, wherein the width of the auxiliary electrode in the first direction is 7 μm to 60 μm.

11. The display panel of claim 1, wherein the base substrate is divided into a first light emitting region configured to emit light in a first wavelength region, a second light emitting region configured to emit light in a second wavelength region, a third light emitting region configured to emit light in a third wavelength region different from the first wavelength region and the second wavelength region, and a non-light emitting region surrounding each of the first to third light emitting regions, and the auxiliary electrode is in the non-light emitting region.

12. The display panel of claim 11, wherein:

each of the first light emitting region, the second light emitting region, and the third light emitting region is provided in plurality; and the auxiliary electrode is between the plurality of first light emitting regions.

13. The display panel of claim 12, wherein a distance between two first light emitting regions adjacent along the first direction among the plurality of first light emitting regions is defined as a first distance, and a width of the auxiliary electrode in the first direction is 4% to 20% of the first distance.

14. The display panel of claim 1, wherein the organic layer comprises:

an opening region overlapping the plurality of openings;

an intermediate region surrounding the plurality of openings; and a protruding region which surrounds the intermediate region and in which the protrusion is located, wherein a slope of the organic layer in the intermediate region is smaller than that of the organic layer in the protruding region.

15. A display device comprises:

a display panel including an emission layer configured to emit a source light, and a light control member on the display panel and including a plurality of light control patterns configured to transmit the source light or to convert a wavelength of the source light, wherein the display panel includes:

a base substrate configured to provide a base surface parallel to a plane defined by a first direction and a second direction crossing the first direction;

a circuit layer on the base substrate;

a first electrode in a first region on the circuit layer;

an auxiliary electrode in a second region on the circuit layer and spaced apart from the first electrode;

an organic layer on the first electrode and the auxiliary electrode and including a plurality of openings overlapping the auxiliary electrode, the organic layer including at least one emission layer; and a second electrode on the organic layer, wherein:

the second electrode is electrically connected to the auxiliary electrode via each of the plurality of openings;

at least a portion of the organic layer includes a plurality of protrusions having a shape surrounding each of the plurality of openings; and a width of each of the plurality of protrusions in the first direction is 7 μm or more in a plan view.

16. The display device of claim 15, wherein at least one among the plurality of light control patterns includes a quantum dot.

17. The display device of claim 15, wherein the light control member further includes a light shielding pattern between each of the plurality of light control patterns.

18. A method of manufacturing a display panel, the method comprises:

providing a target substrate including a base substrate configured to provide a base surface parallel to a plane defined by a first direction and a second direction crossing the first direction, a pixel electrode on the base substrate, and an auxiliary electrode on a same layer as the pixel electrode;

forming an organic layer including an emission layer on the pixel electrode and the auxiliary electrode;

forming, by emitting a laser, an opening that passes through the organic layer on the auxiliary electrode, and a protrusion adjacent to the opening; and forming a counter electrode on the organic layer, wherein the counter electrode is electrically connected to the auxiliary electrode via the opening, and a width of the protrusion in the first direction is 7 μm or more in a plan view.

19. The method of claim 18, wherein the protrusion is formed by the laser at the same time in the forming of the opening, and surrounds the opening in the plan view.

20. The method of claim 18, wherein, in the forming of the opening and the protrusion, an intermediate portion is between the opening and the protrusion, and a slope of the intermediate portion is smaller than that of the organic layer on which the protrusion is located.

* * * * *